US012068441B2

(12) United States Patent
Takiguchi et al.

(10) Patent No.: US 12,068,441 B2
(45) Date of Patent: Aug. 20, 2024

(54) LIGHT-EMITTING DEVICE AND IMAGE DISPLAY APPARATUS

(71) Applicant: Sony Group Corporation, Tokyo (JP)

(72) Inventors: Mikio Takiguchi, Tokyo (JP); Takahiro Koyama, Tokyo (JP); Toyoharu Oohata, Tokyo (JP)

(73) Assignee: Sony Group Corporation, Tokyo (JP)

( * ) Notice: Subject to any disclaimer, the term of this patent is extended or adjusted under 35 U.S.C. 154(b) by 462 days.

(21) Appl. No.: 17/425,411

(22) PCT Filed: Jan. 15, 2020

(86) PCT No.: PCT/JP2020/001059
§ 371 (c)(1),
(2) Date: Jul. 23, 2021

(87) PCT Pub. No.: WO2020/153191
PCT Pub. Date: Jul. 30, 2020

(65) Prior Publication Data
US 2022/0093833 A1 Mar. 24, 2022

(30) Foreign Application Priority Data
Jan. 25, 2019 (JP) ................. 2019-010813

(51) Int. Cl.
H01L 33/60 (2010.01)
H01L 25/075 (2006.01)
(Continued)

(52) U.S. Cl.
CPC .......... H01L 33/60 (2013.01); H01L 25/0753 (2013.01); H01L 33/005 (2013.01);
(Continued)

(58) Field of Classification Search
CPC ... H01L 33/60; H01L 25/0753; H01L 33/005; H01L 33/38; H01L 33/46; H01L 33/502;
(Continued)

(56) References Cited

U.S. PATENT DOCUMENTS

2003/0232455 A1  12/2003  Tanaka
2007/0121696 A1  5/2007  Ishii
(Continued)

FOREIGN PATENT DOCUMENTS

JP  2003258300 A  9/2003
JP  2005150393 A  6/2005
(Continued)

OTHER PUBLICATIONS

International Search Report mailed Mar. 31, 2020 in connection with PCT/JP2020/001059.

*Primary Examiner* — Patricia D Valenzuela
(74) *Attorney, Agent, or Firm* — K&L Gates LLP

(57) ABSTRACT

A light-emitting device according to one embodiment of the present disclosure includes: a reflective structure having a first surface and a second surface and having, on the first surface, an opening whose side surface is provided with a first reflective film; a semiconductor light-emitting element including a first conductivity-type layer, an active layer, and a second conductivity-type layer that are stacked, the opening of the reflective structure and the active layer being disposed to be opposed to each other; and a support member having a light-transmitting property and having a first surface and a second surface, the semiconductor light-emitting element being disposed on the first surface side, the reflective structure being disposed on the second surface side, the second surface being at least partially in contact with the first surface of the reflective structure.

18 Claims, 27 Drawing Sheets

(51) Int. Cl.
*H01L 33/00* (2010.01)
*H01L 33/38* (2010.01)
*H01L 33/46* (2010.01)
*H01L 33/50* (2010.01)
*H01L 33/58* (2010.01)
*B82Y 20/00* (2011.01)
*H01L 33/40* (2010.01)

(52) U.S. Cl.
CPC .............. *H01L 33/38* (2013.01); *H01L 33/46* (2013.01); *H01L 33/502* (2013.01); *H01L 33/58* (2013.01); *B82Y 20/00* (2013.01); *H01L 33/0093* (2020.05); *H01L 33/405* (2013.01); *H01L 2933/0016* (2013.01); *H01L 2933/0025* (2013.01); *H01L 2933/0058* (2013.01); *H01L 2933/0091* (2013.01)

(58) Field of Classification Search
CPC ............. H01L 33/58; H01L 2933/0016; H01L 2933/0025; H01L 2933/0058; H01L 2933/0091; H01L 33/505; H01L 33/405; H01L 33/0093; B82Y 20/00
See application file for complete search history.

(56) References Cited

U.S. PATENT DOCUMENTS

| | | | |
|---|---|---|---|
| 2007/0194327 A1* | 8/2007 | Ueda | H01L 33/405 |
| | | | 257/E33.068 |
| 2010/0244065 A1* | 9/2010 | Butterworth | H01L 33/007 |
| | | | 257/E21.085 |
| 2011/0316032 A1* | 12/2011 | Ooyabu | H01L 33/505 |
| | | | 252/301.36 |
| 2019/0004217 A1* | 1/2019 | Couillard | F21V 5/04 |

FOREIGN PATENT DOCUMENTS

| | | |
|---|---|---|
| JP | 2007235122 A | 9/2007 |
| JP | 2010141273 A | 6/2010 |
| JP | 2013084881 A | 5/2013 |
| JP | 2013106048 A | 5/2013 |
| JP | 2016163015 A | 9/2016 |
| JP | 2017108111 A | 6/2017 |
| WO | 2018235231 A1 | 12/2018 |

* cited by examiner

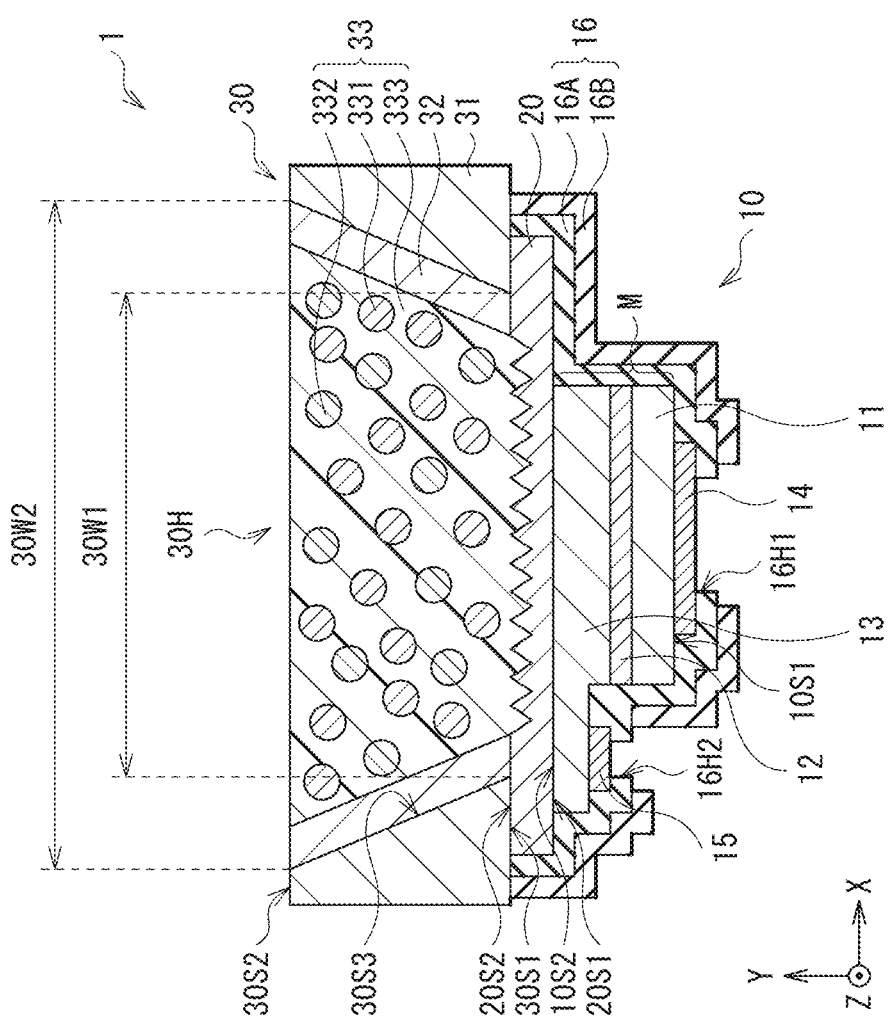
[ FIG. 1 ]

[FIG. 2A]
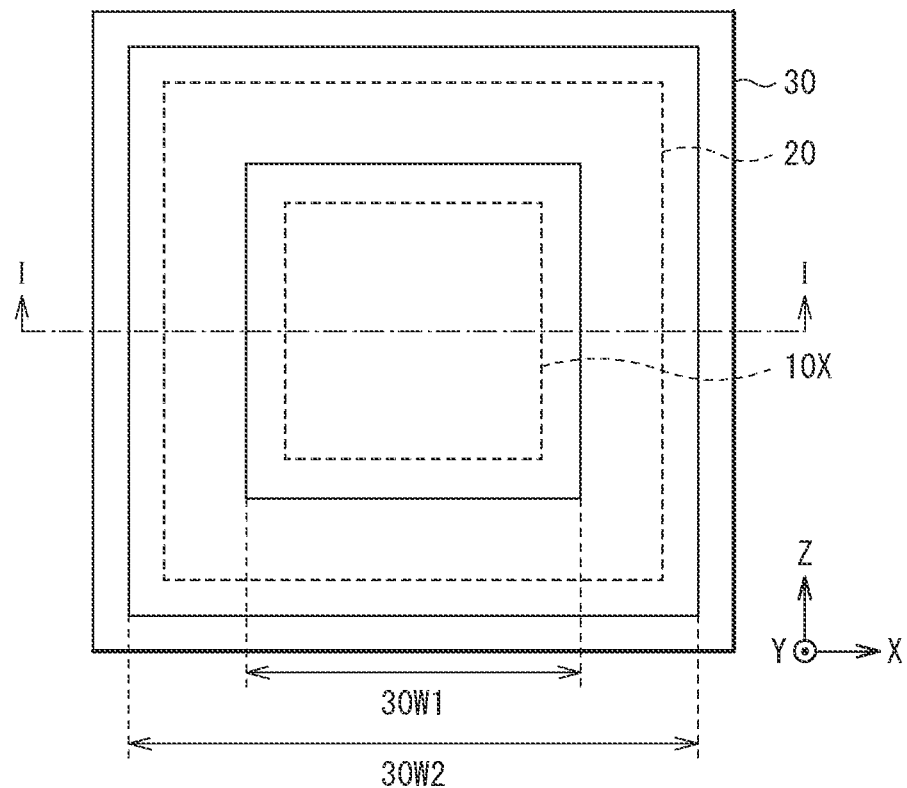
[FIG. 2B]
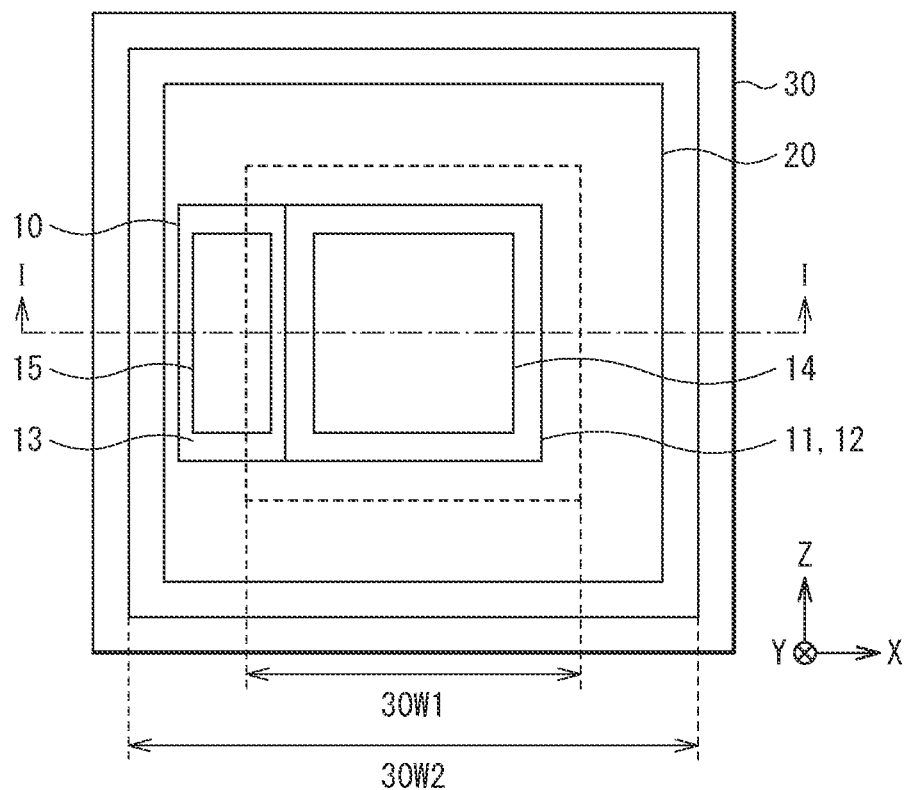

[ FIG. 3A ]
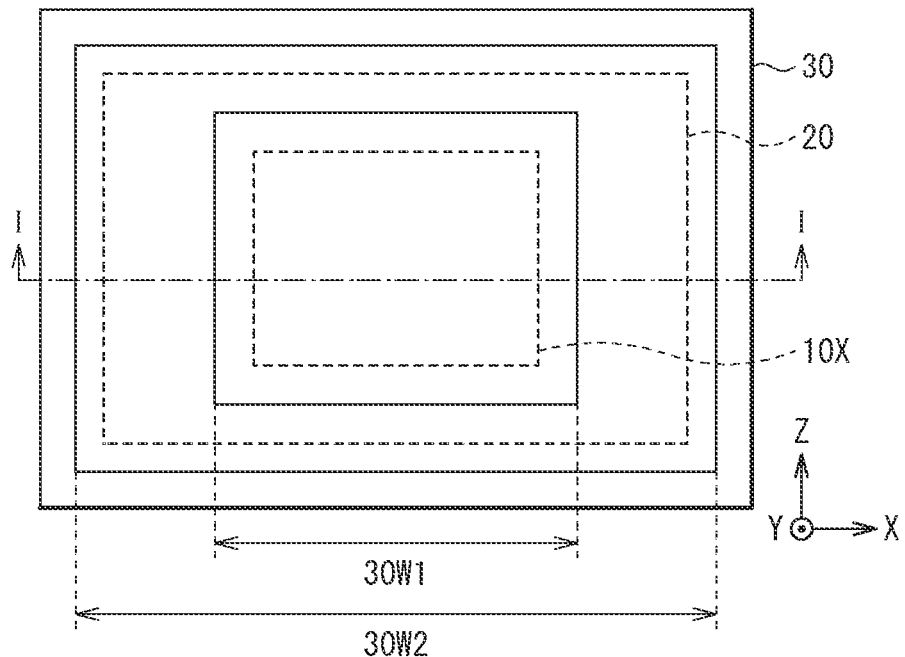
[ FIG. 3B ]
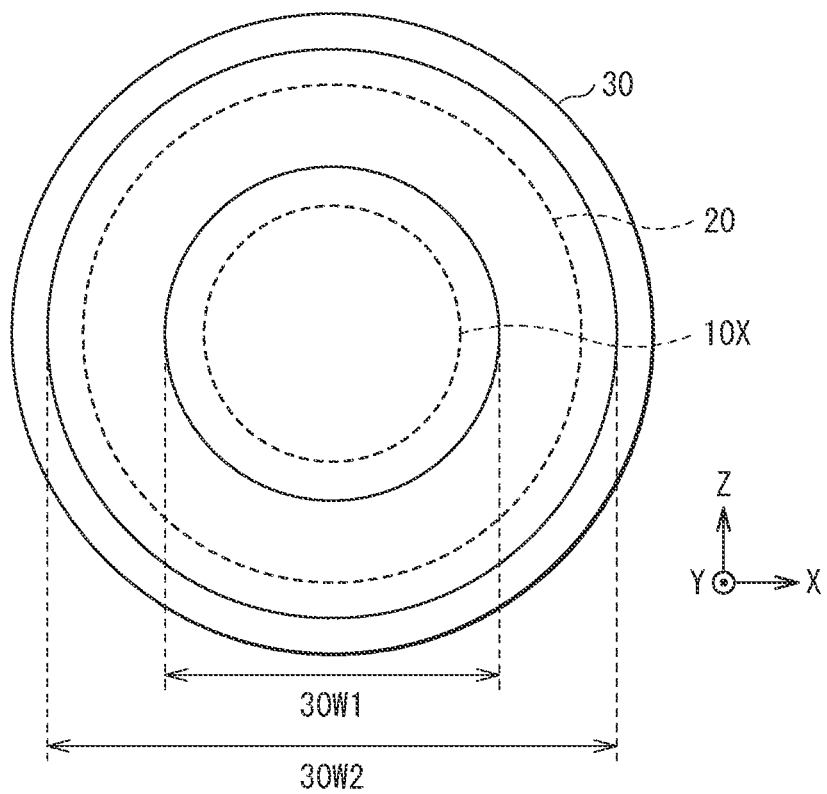

[ FIG. 3C ]
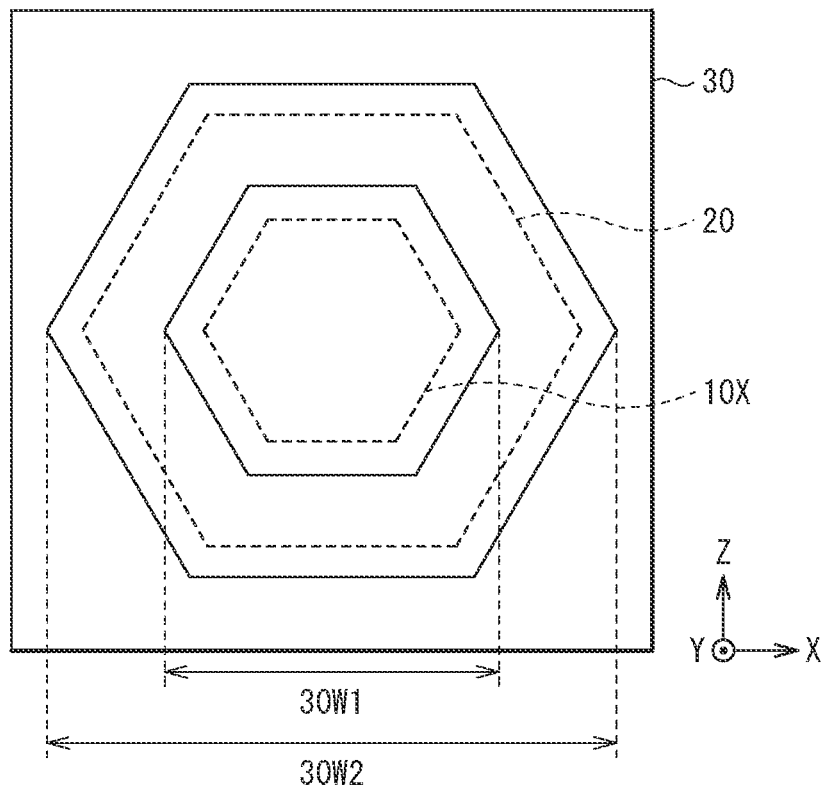
[ FIG. 4A ]
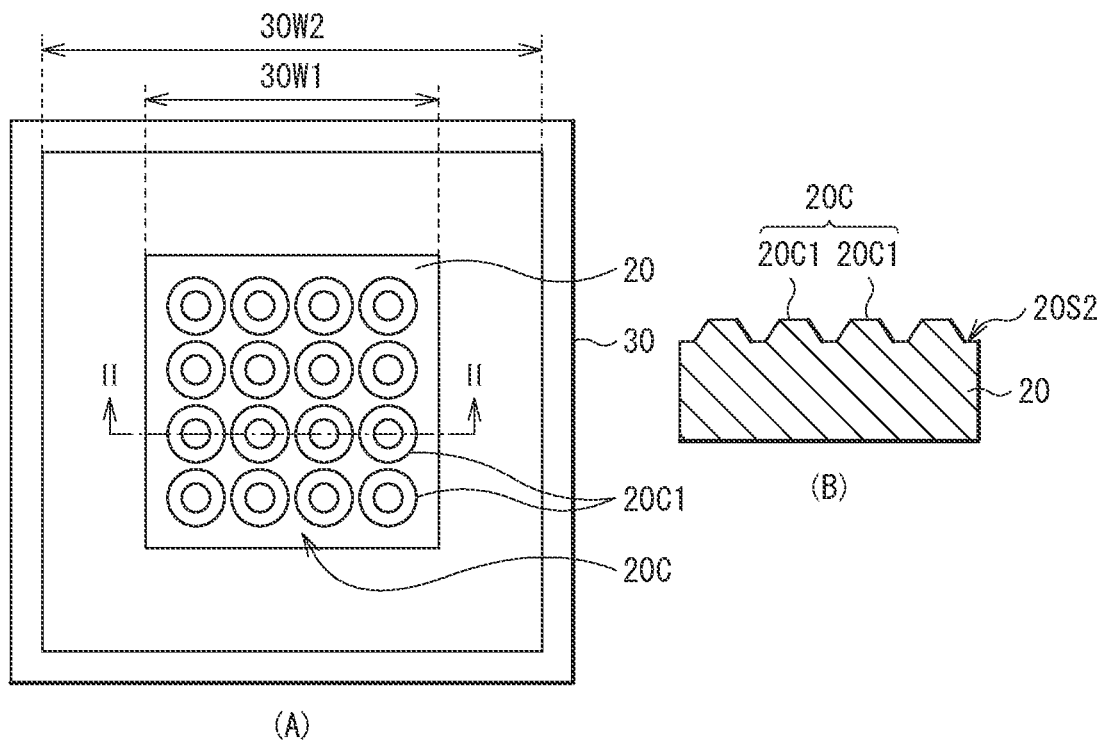

[ FIG. 4B ]
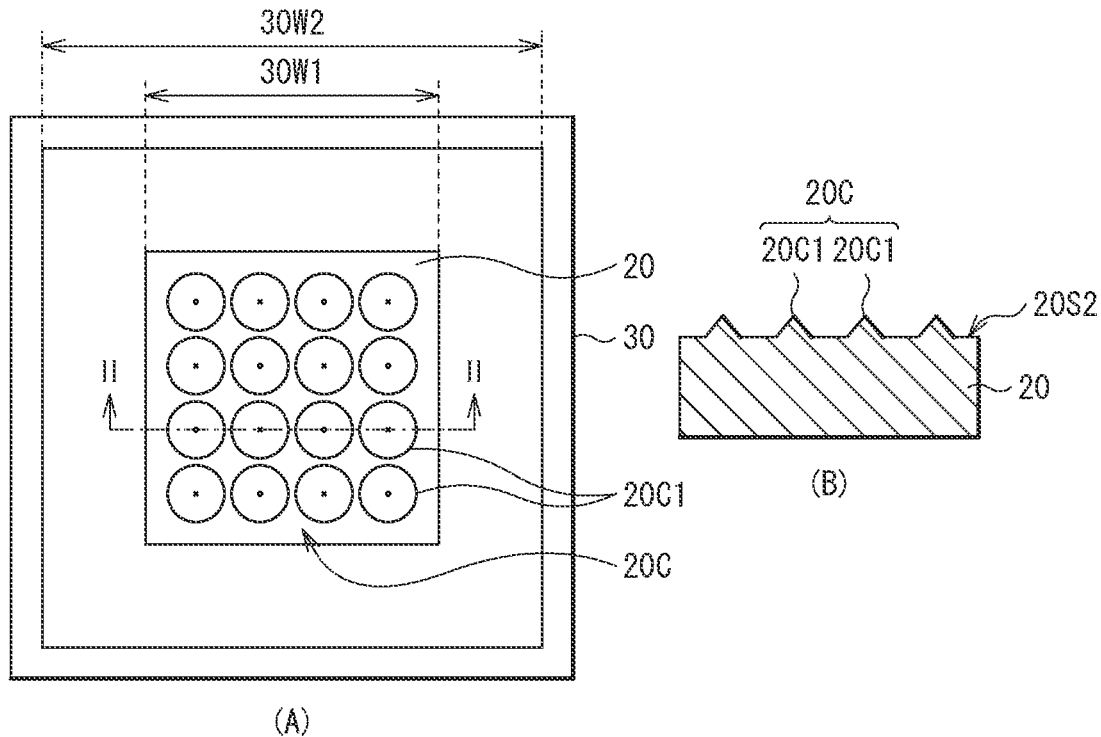
[ FIG. 4C ]
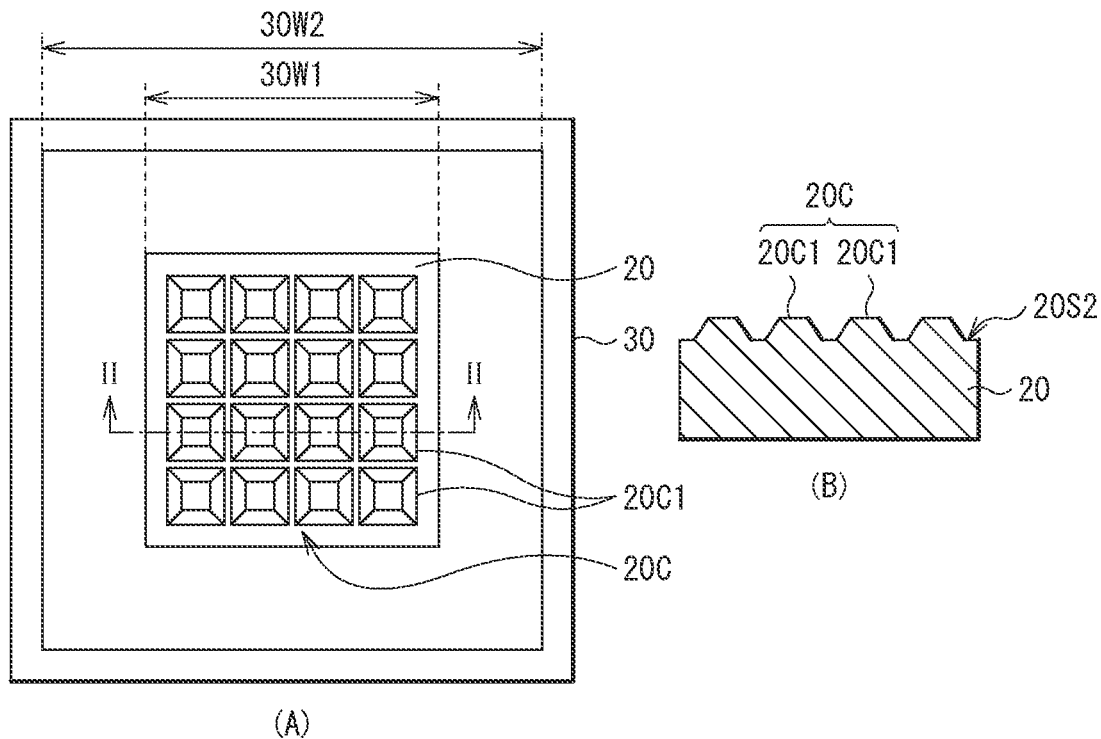

[ FIG. 4D ]
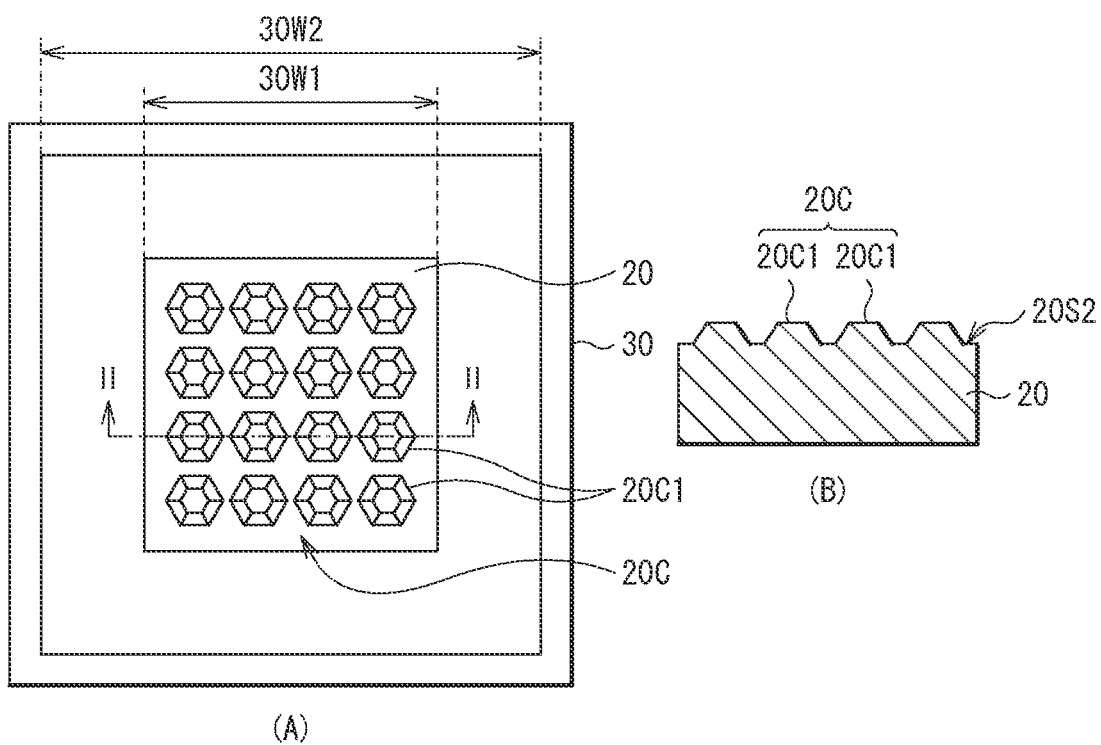

[ FIG. 5A ]
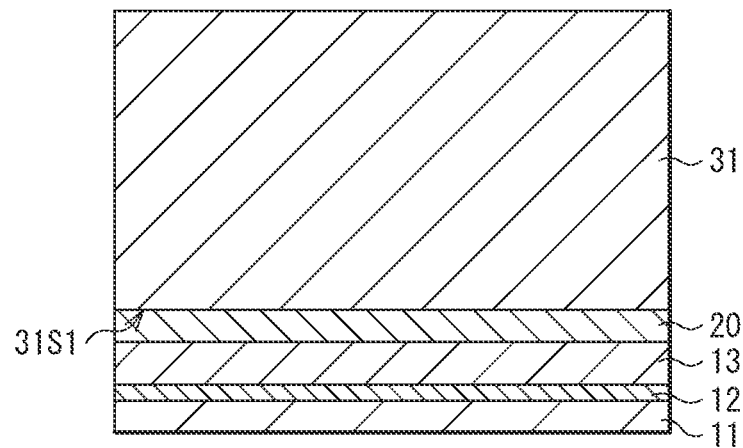
[ FIG. 5B ]
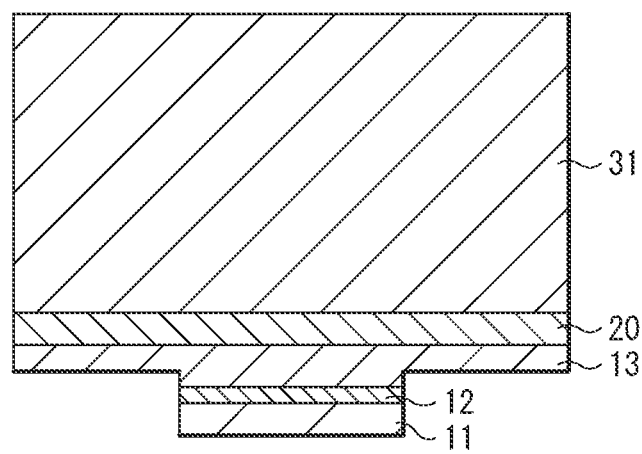
[ FIG. 5C ]
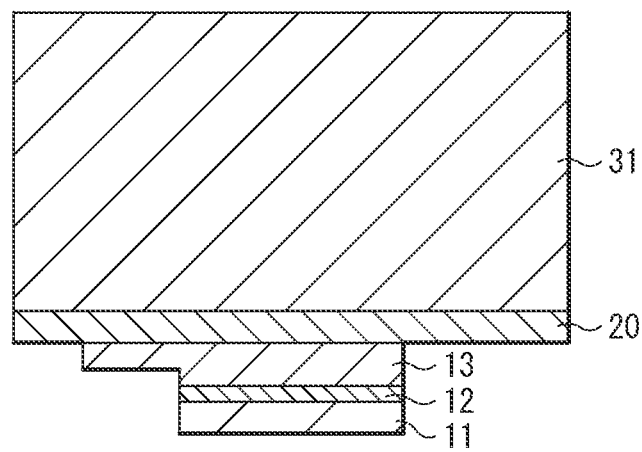

[ FIG. 5D ]
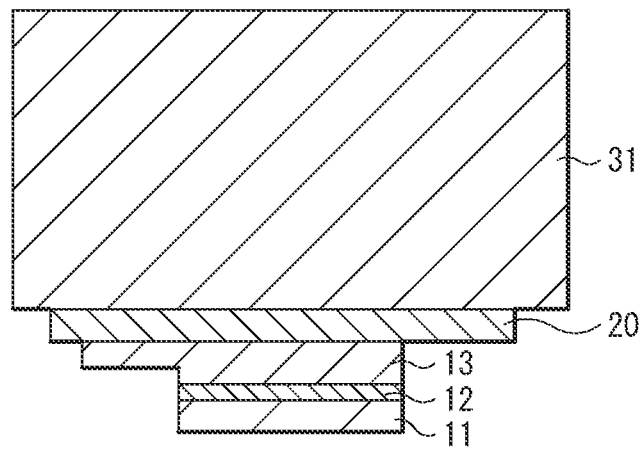
[ FIG. 5E ]
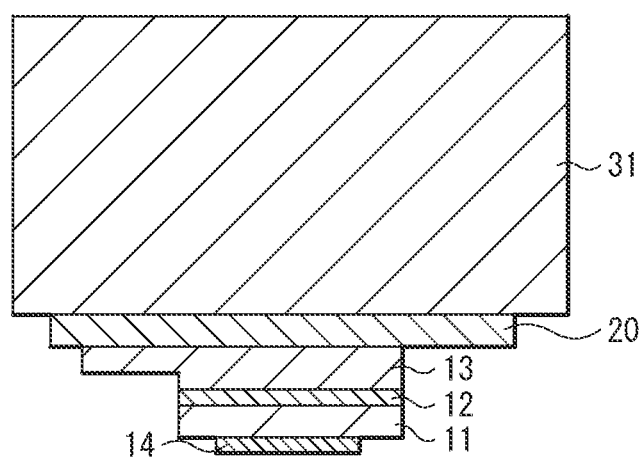
[ FIG. 5F ]
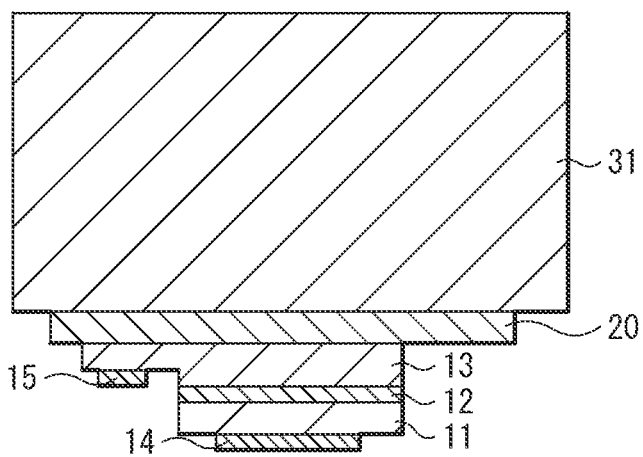

[ FIG. 5G ]
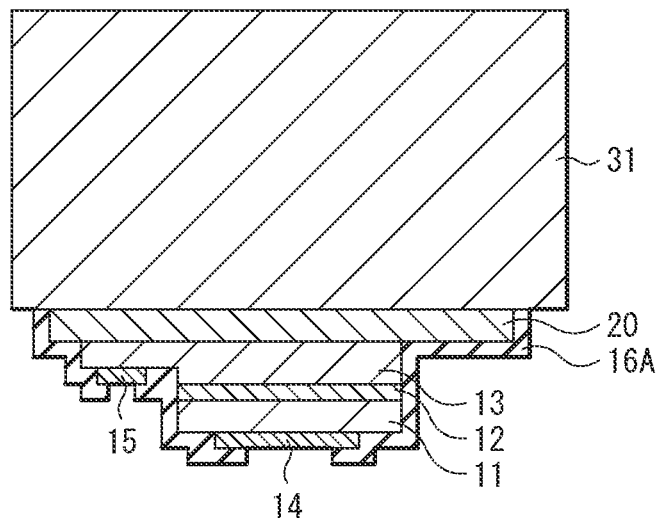
[ FIG. 5H ]
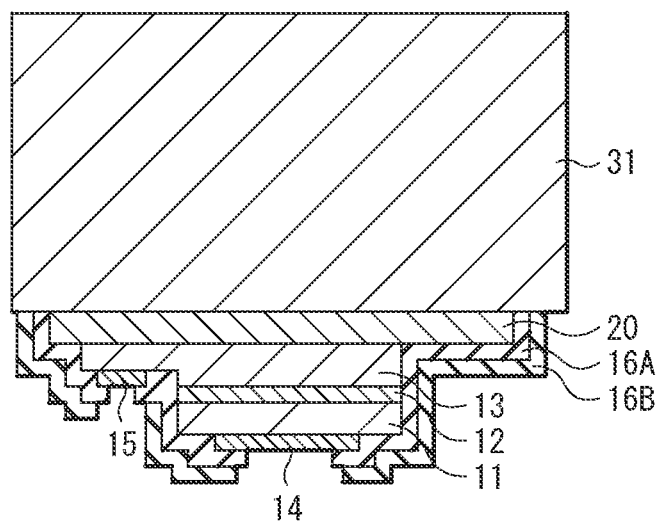
[ FIG. 5I ]
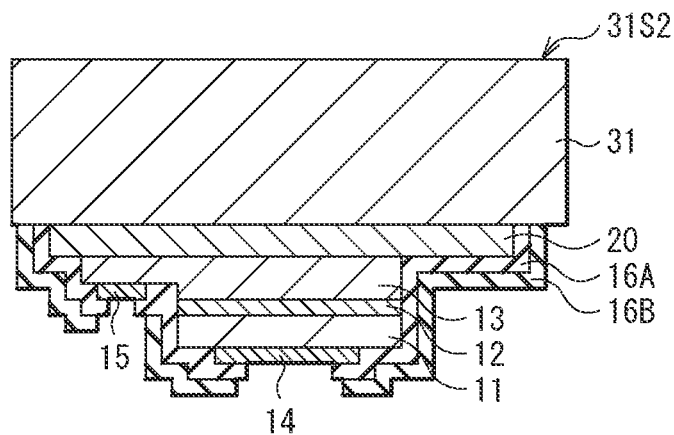

[ FIG. 5J ]
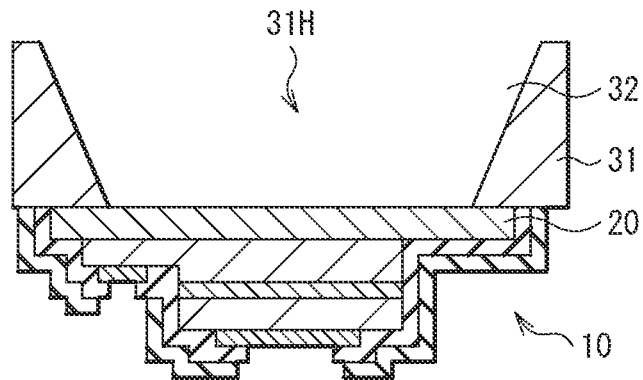
[ FIG. 5K ]
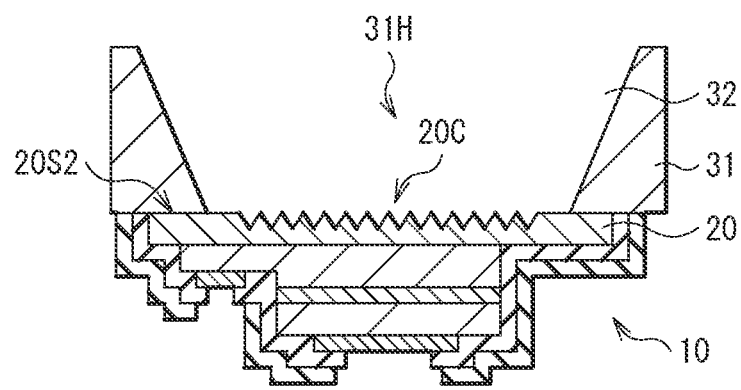
[ FIG. 5L ]
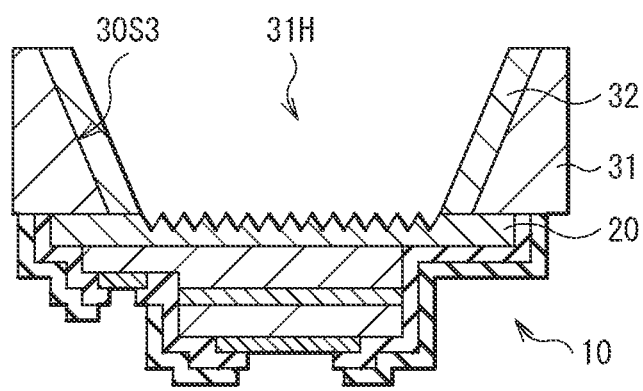

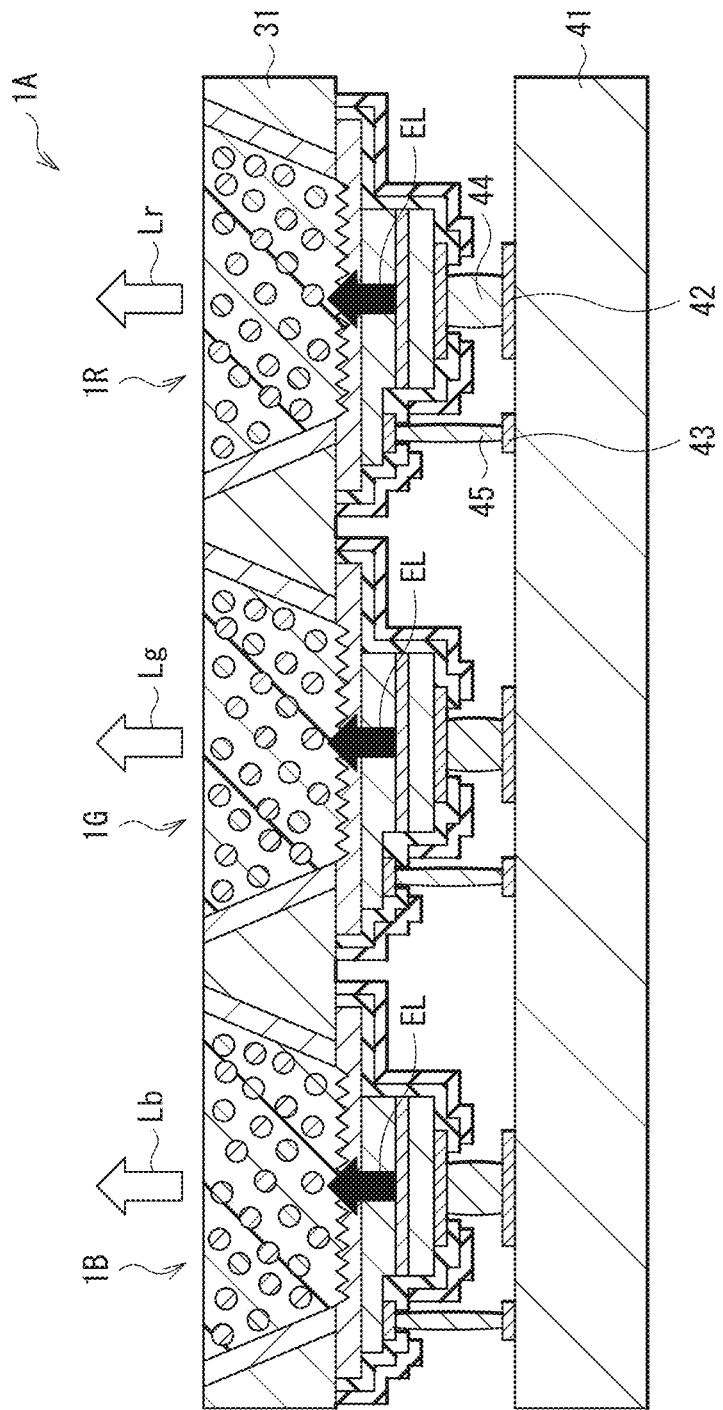
[FIG. 6]

[FIG. 7]
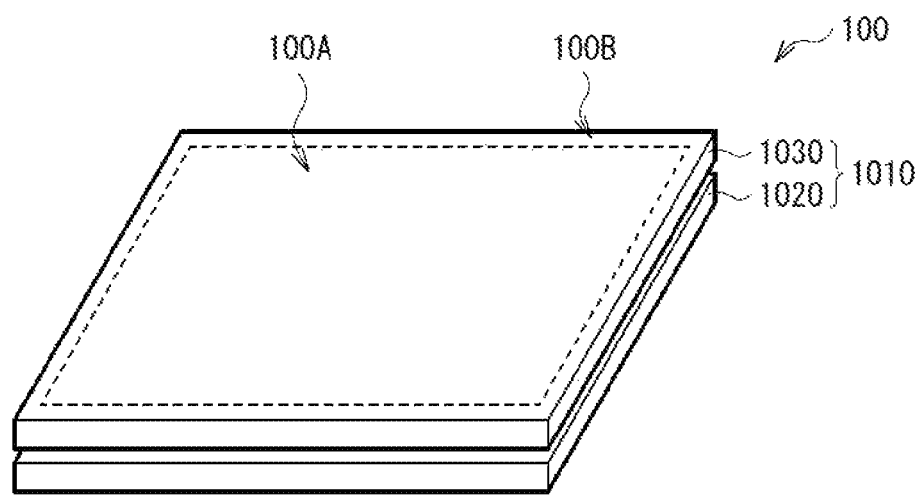
[FIG. 8]
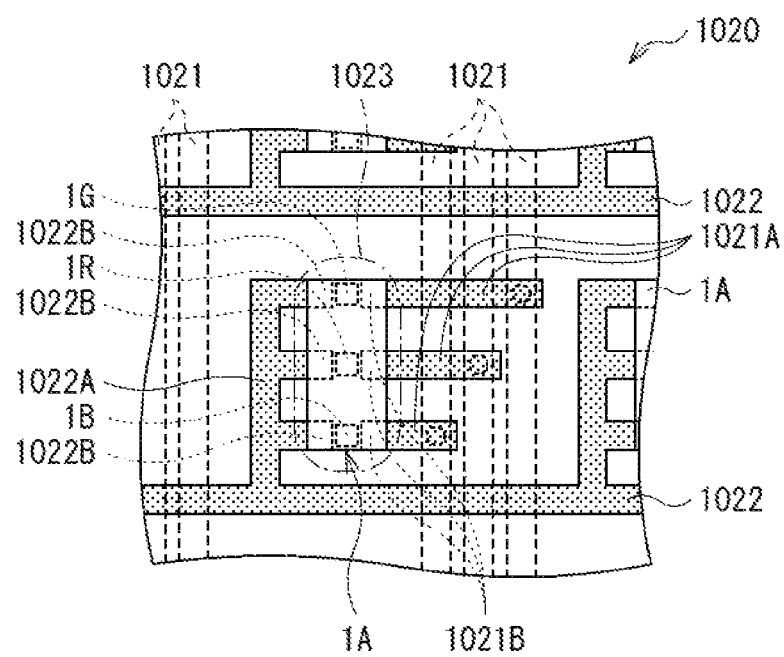

[ FIG. 10 ]
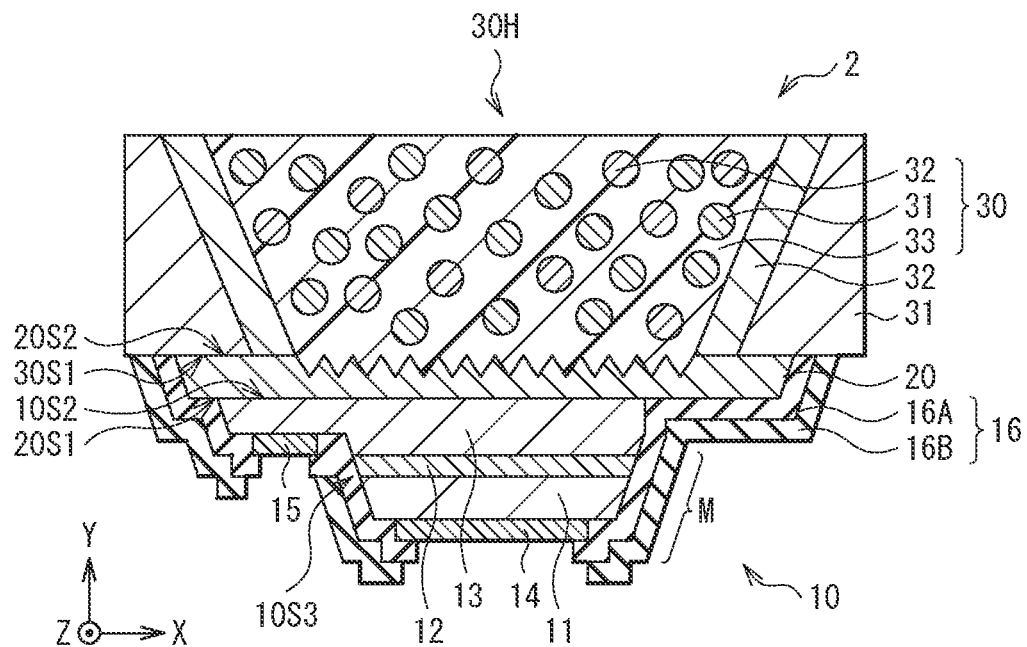
[ FIG. 11 ]
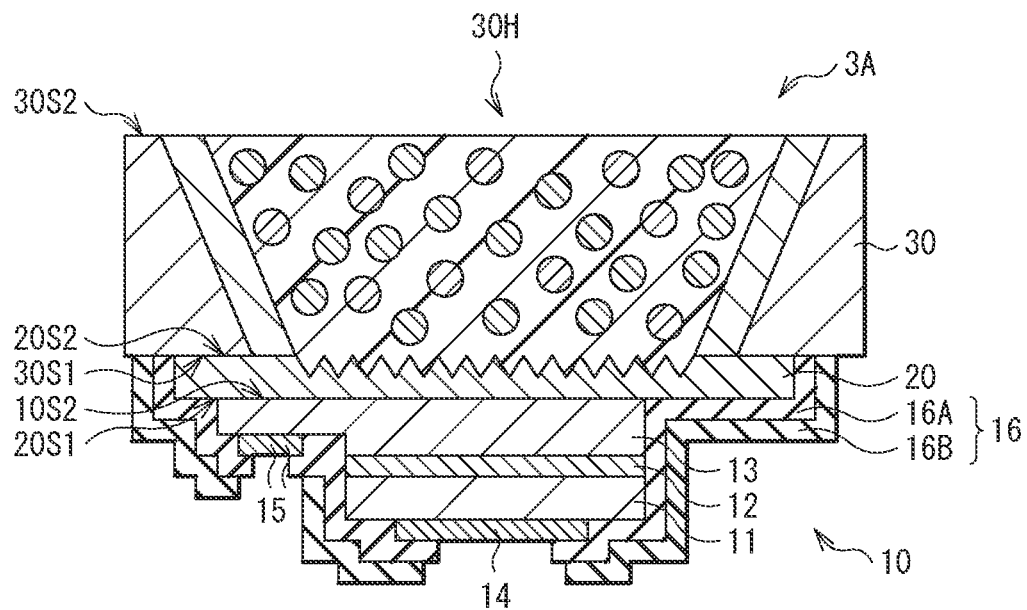

[ FIG. 12 ]
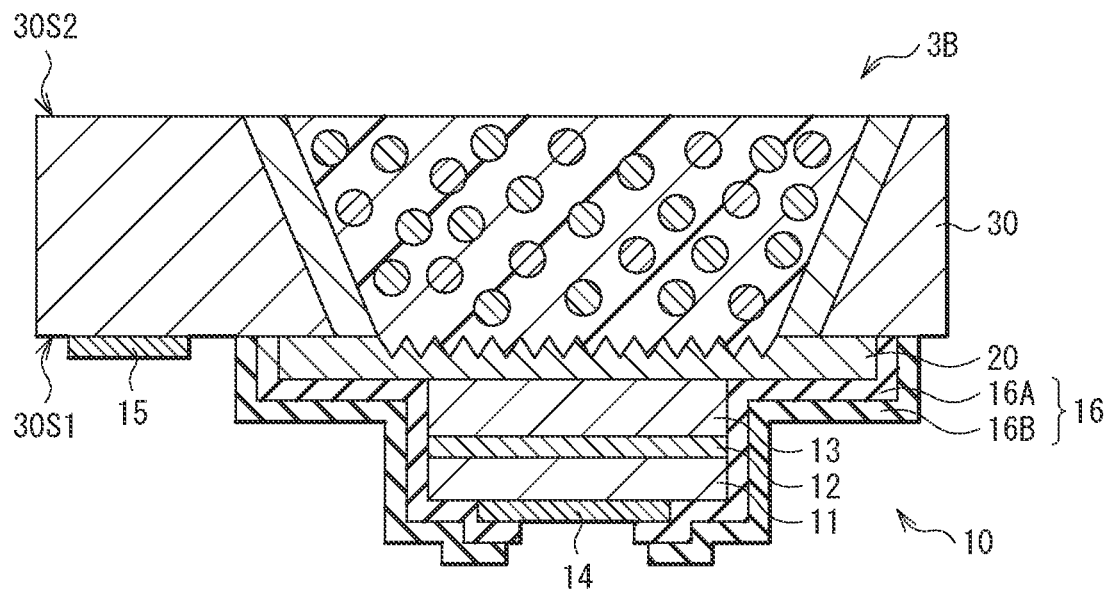
[ FIG. 13 ]
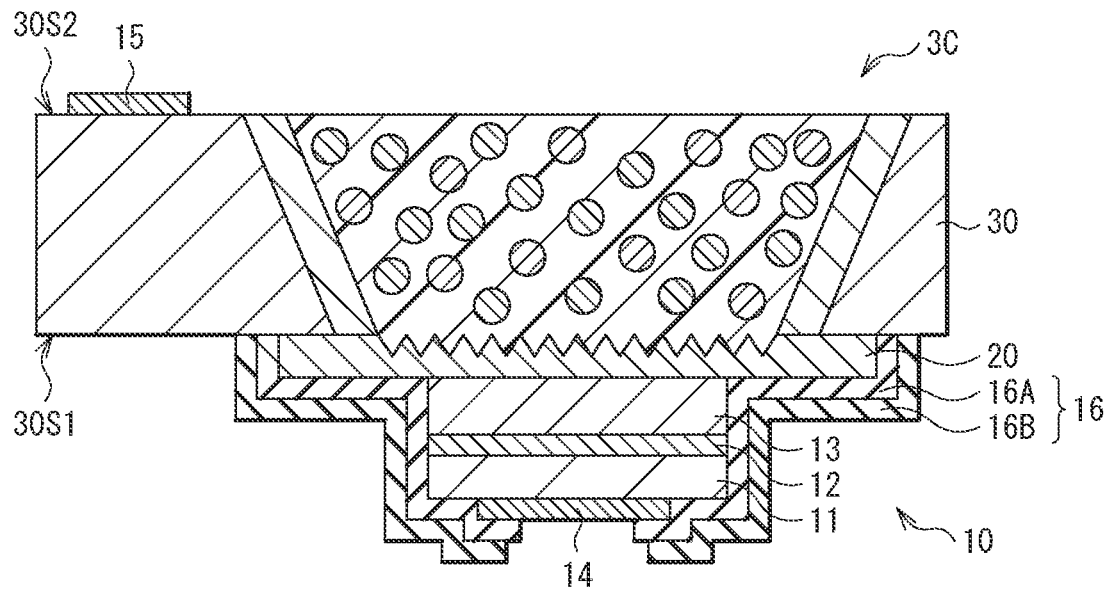

[ FIG. 14A ]
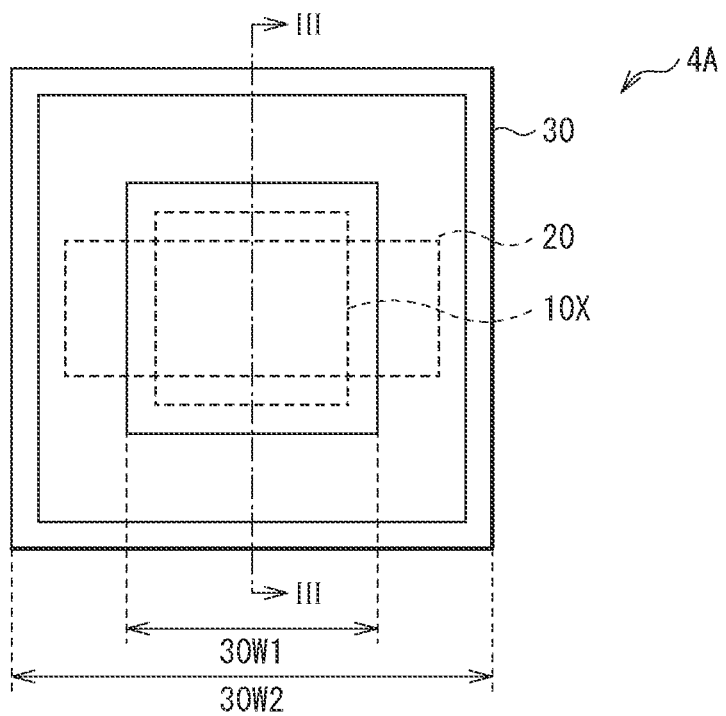
[ FIG. 14B ]
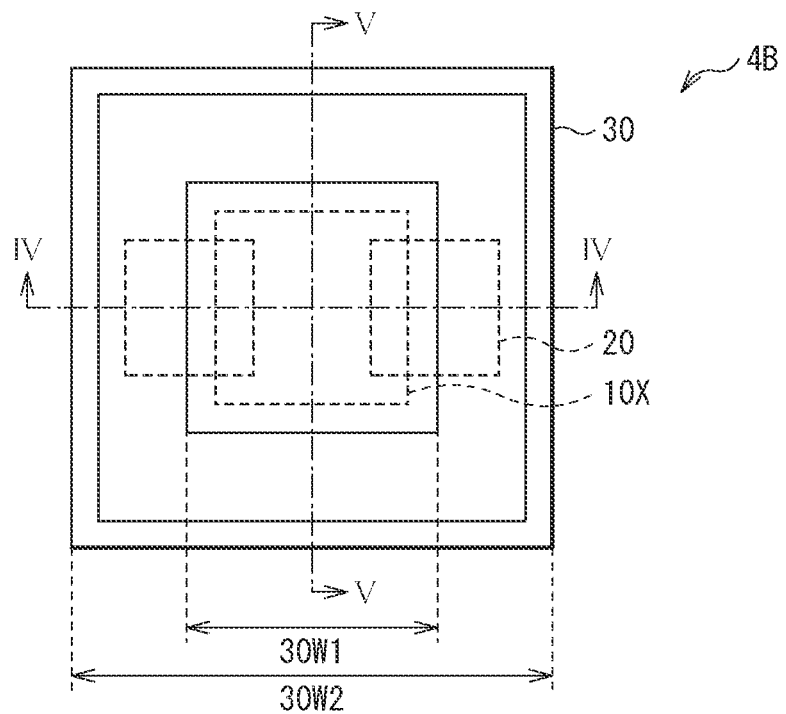

[ FIG. 14C ]
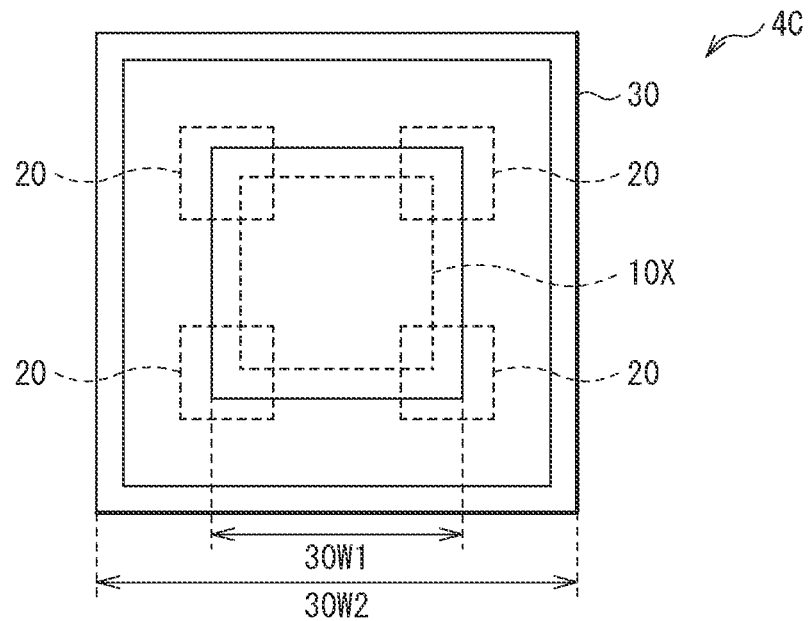
[ FIG. 15 ]
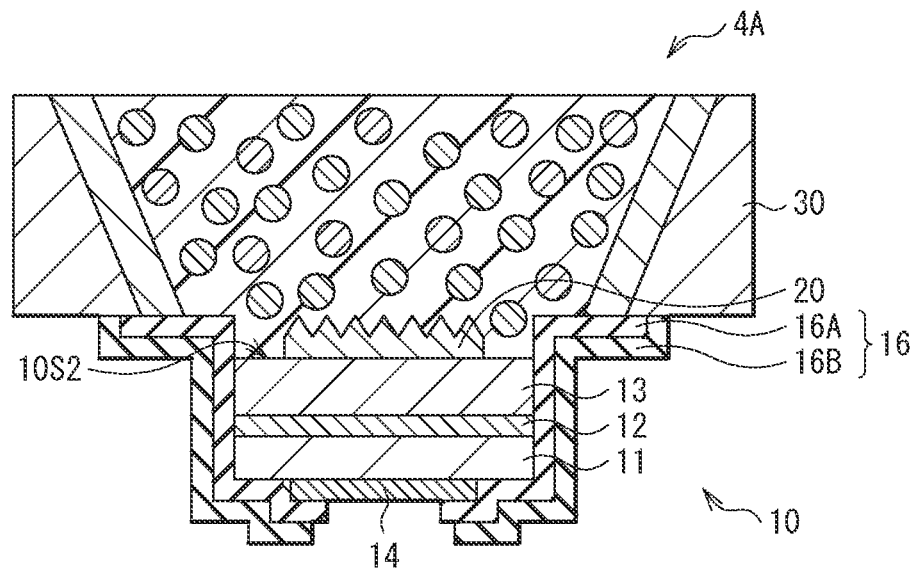

[ FIG. 16A ]
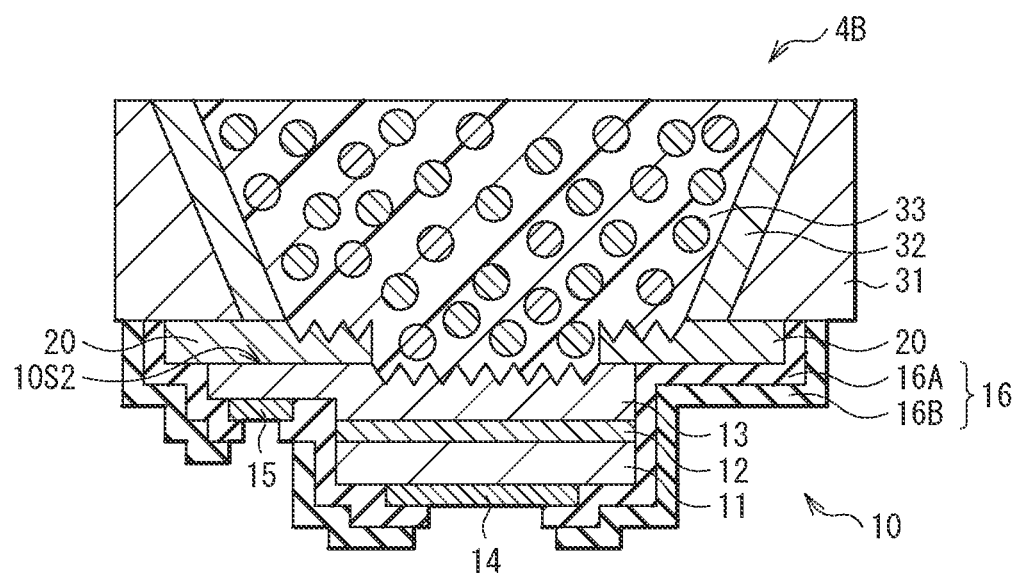
[ FIG. 16B ]
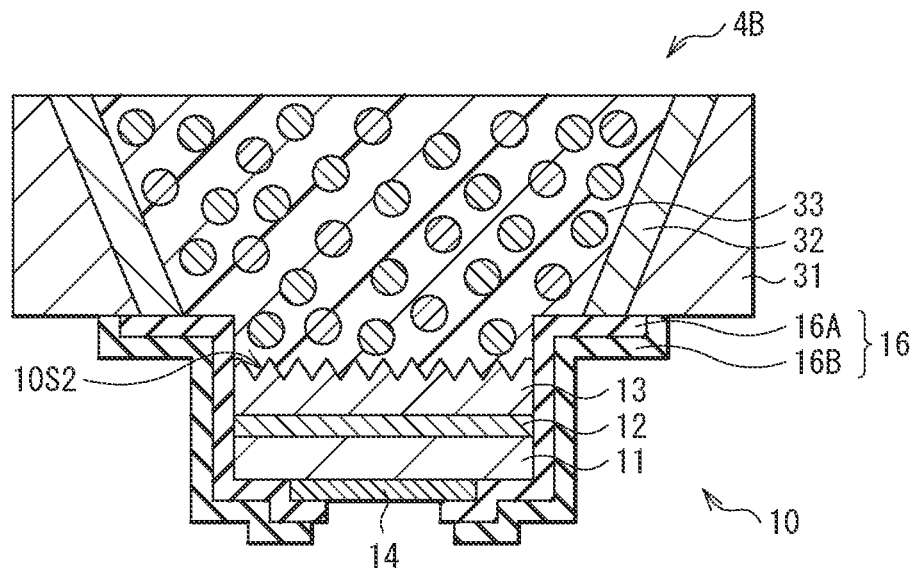

[FIG. 17]
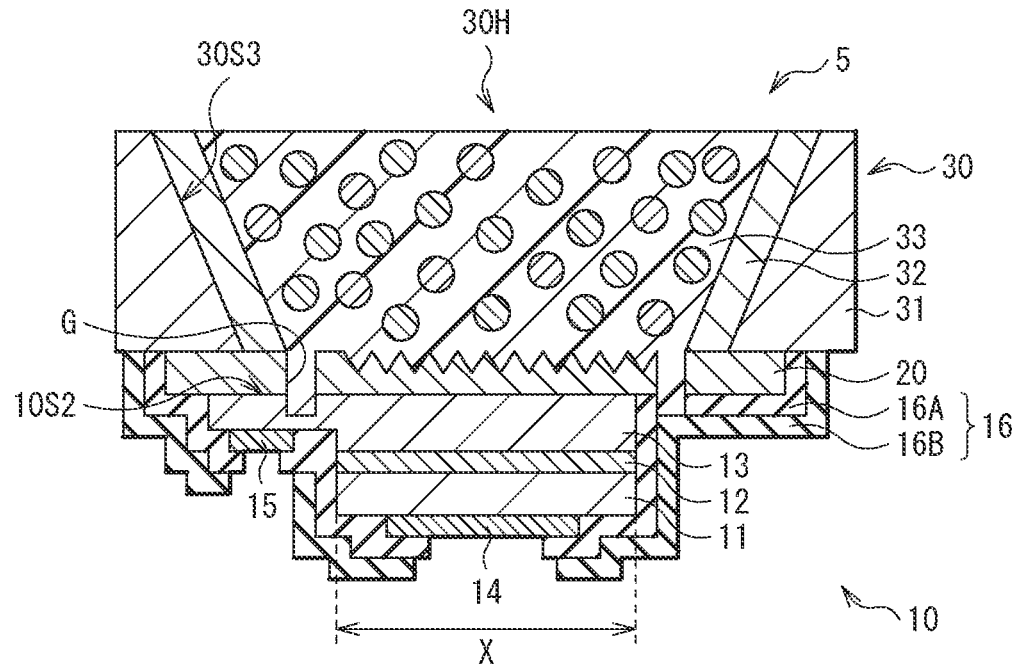
[FIG. 18]
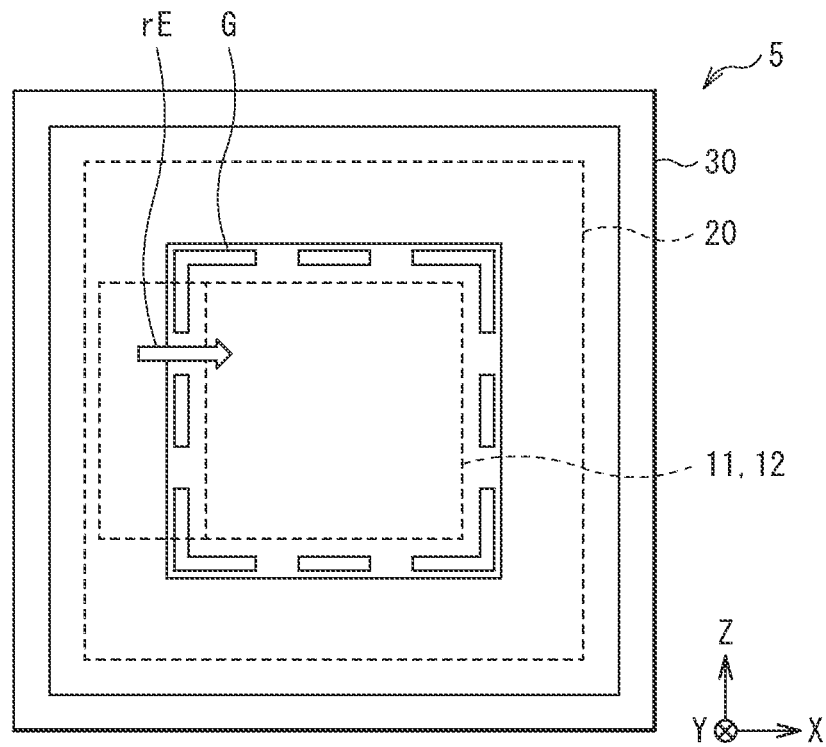

[ FIG. 19 ]
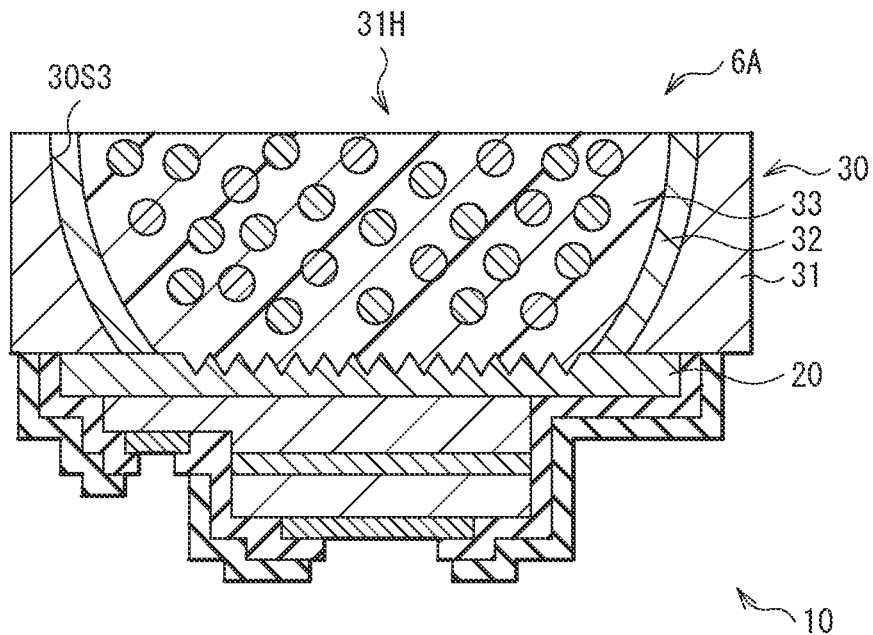
[ FIG. 20 ]
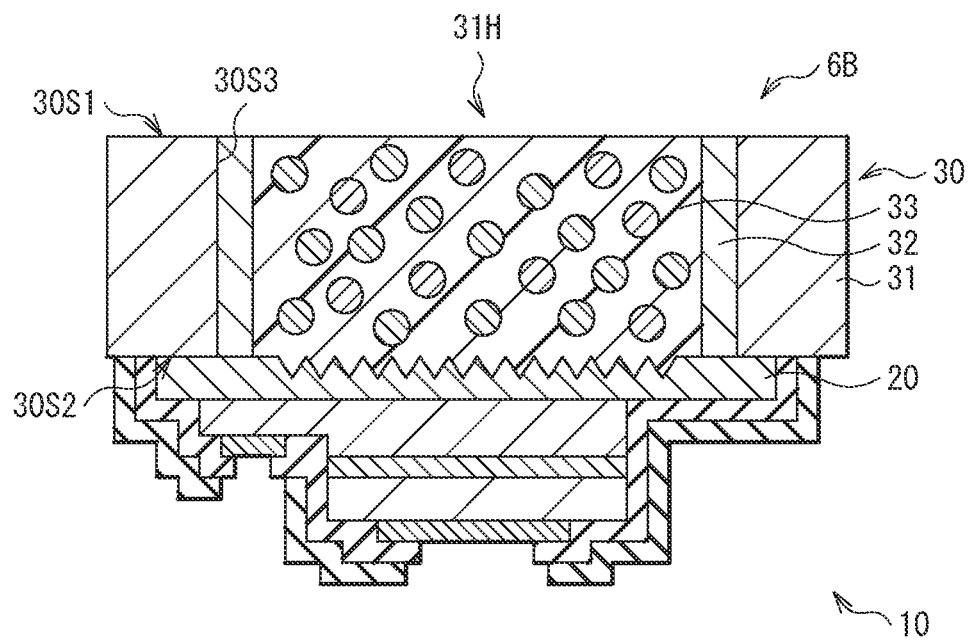

[ FIG. 21 ]
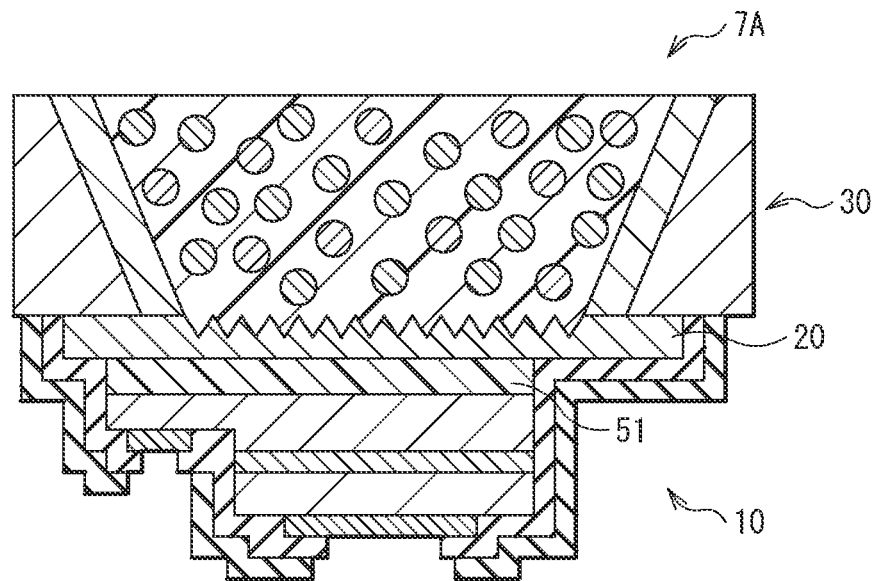
[ FIG. 22 ]
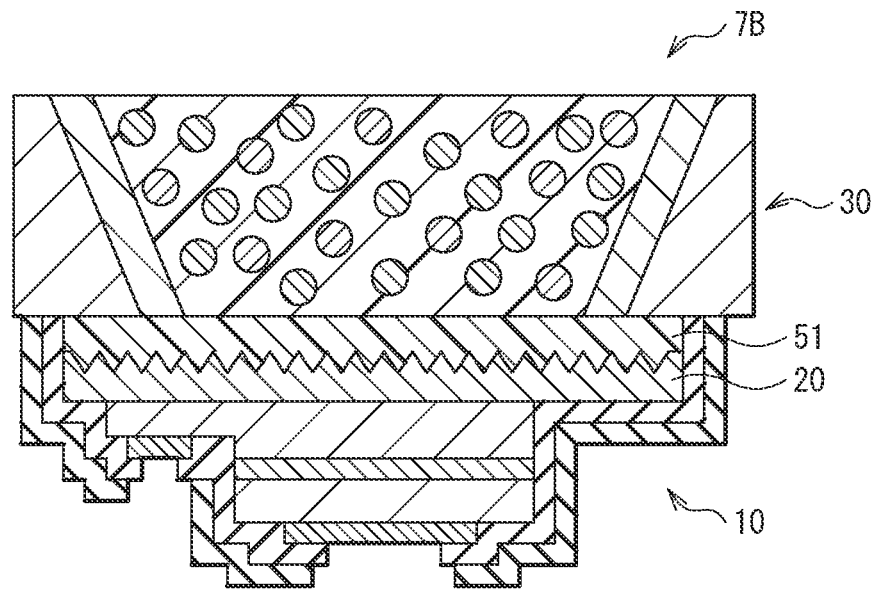

[ FIG. 23 ]
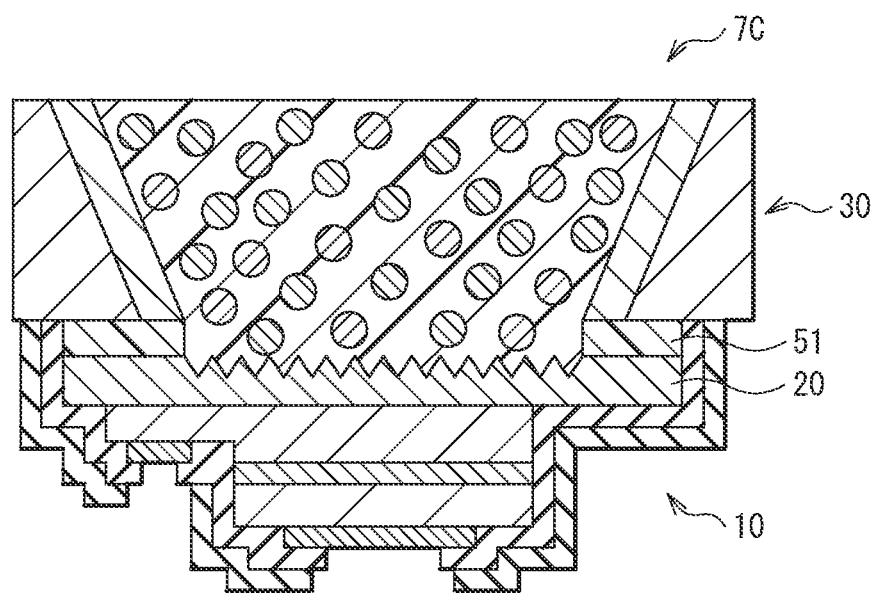
[ FIG. 24 ]
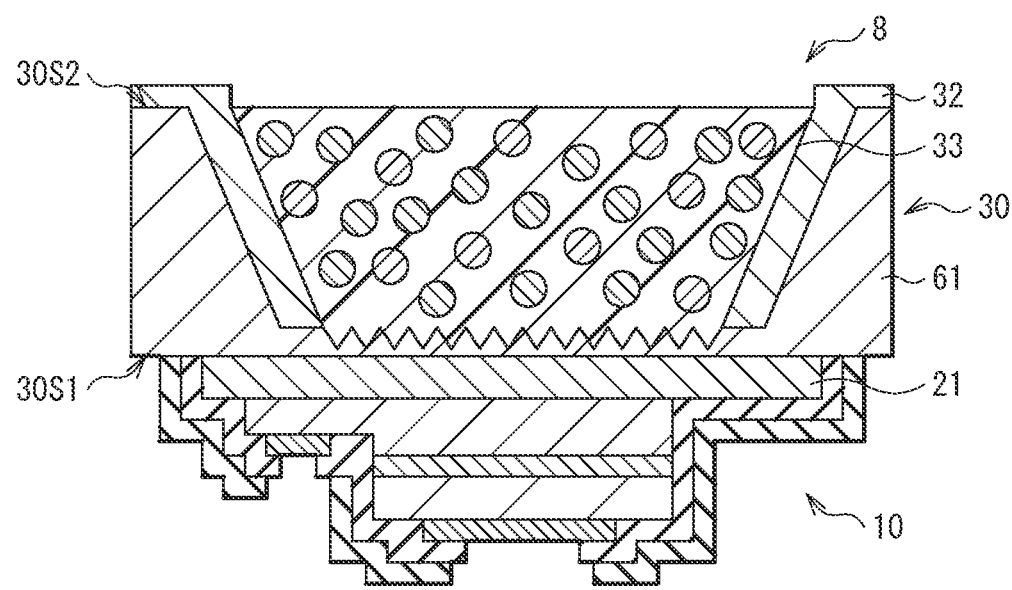

[ FIG. 25 ]
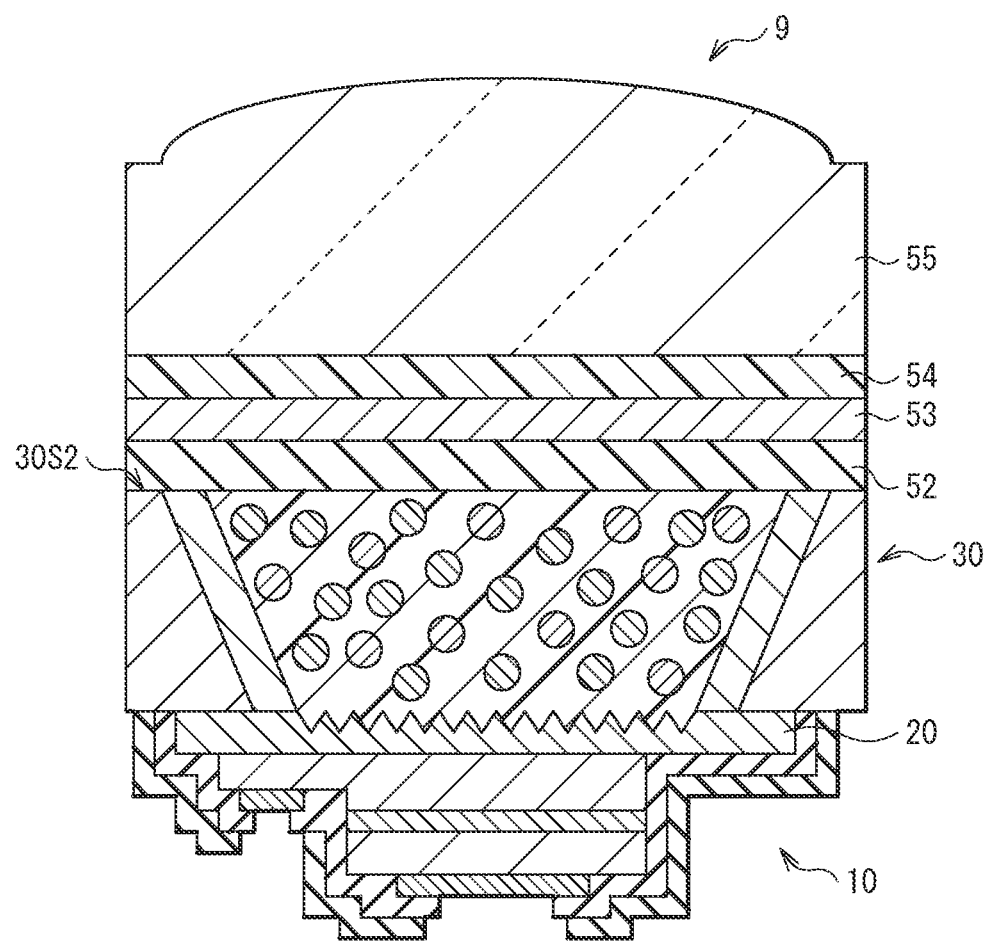

[ FIG. 26 ]
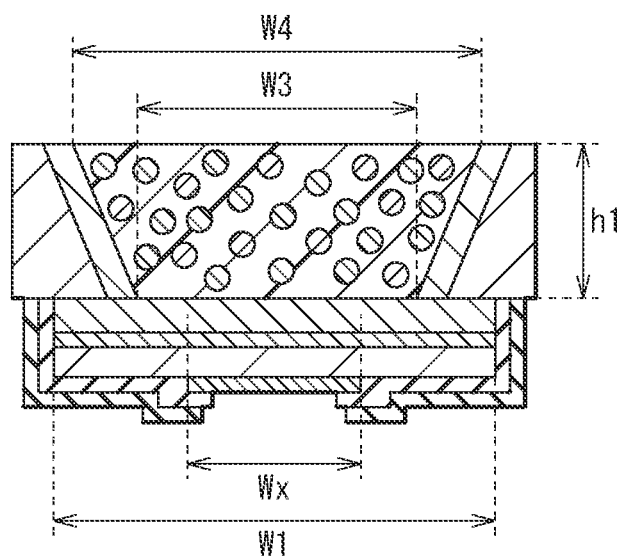
[ FIG. 27 ]
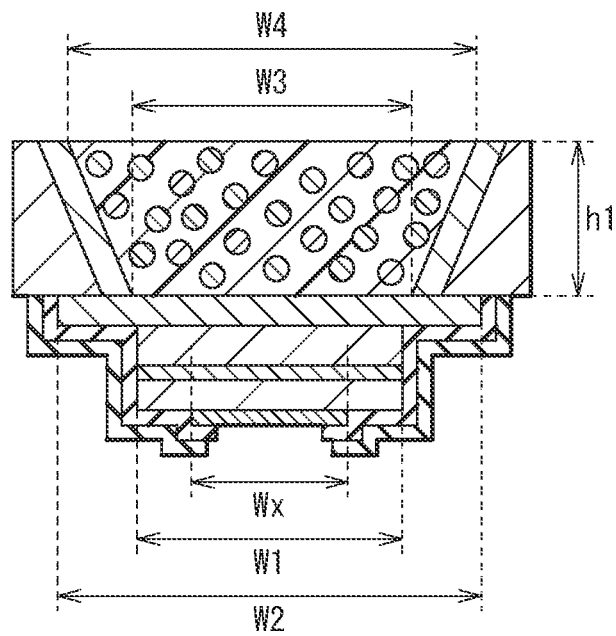

[ FIG. 28 ]
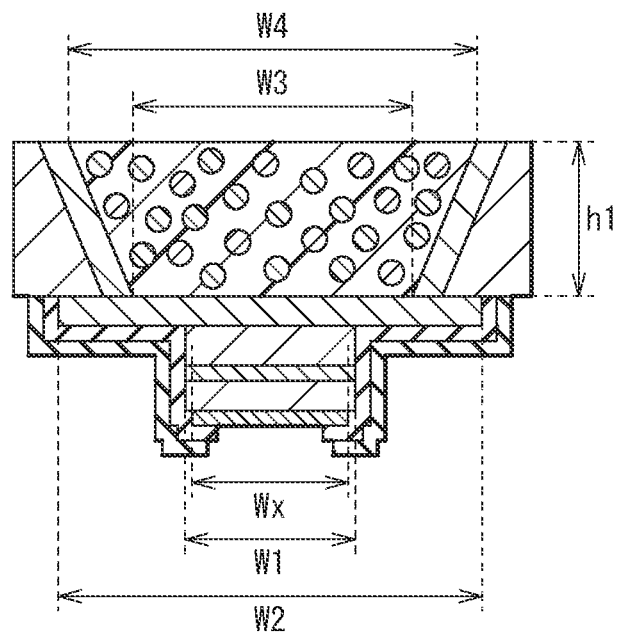
[ FIG. 29 ]
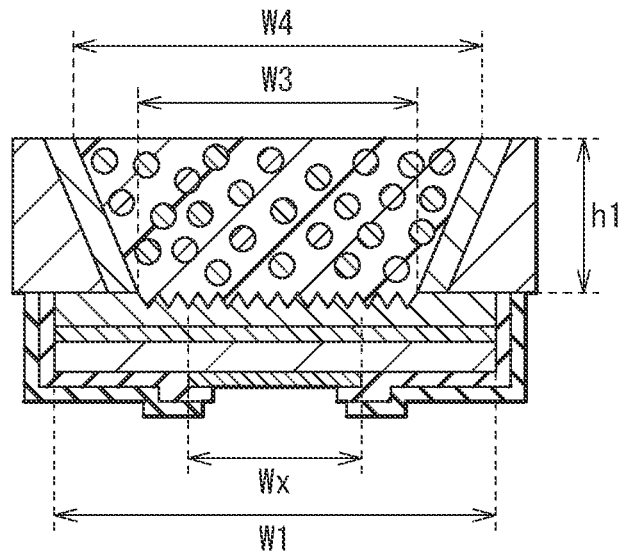

[ FIG. 30 ]
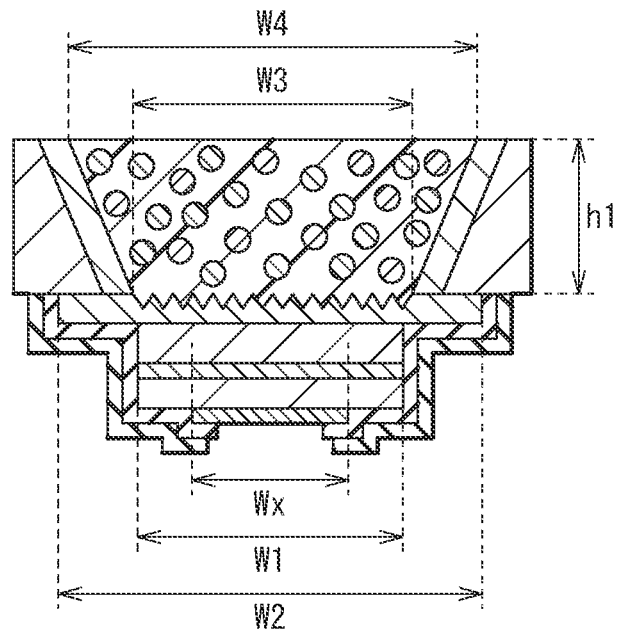
[ FIG. 31 ]
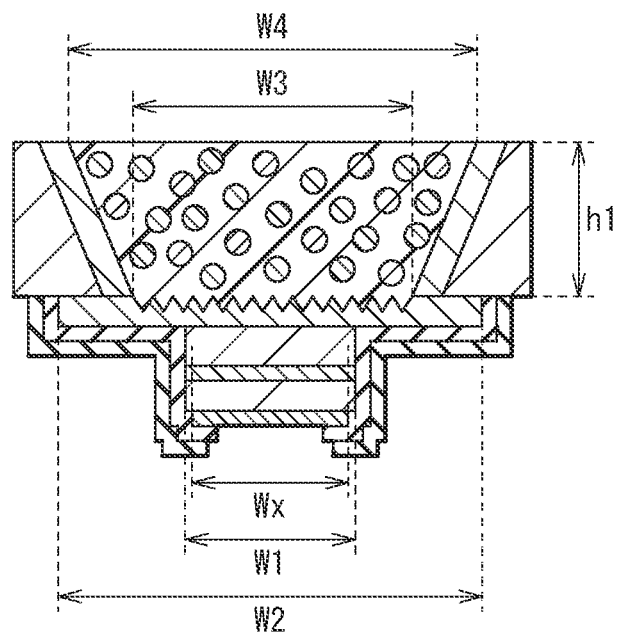

[FIG. 32]
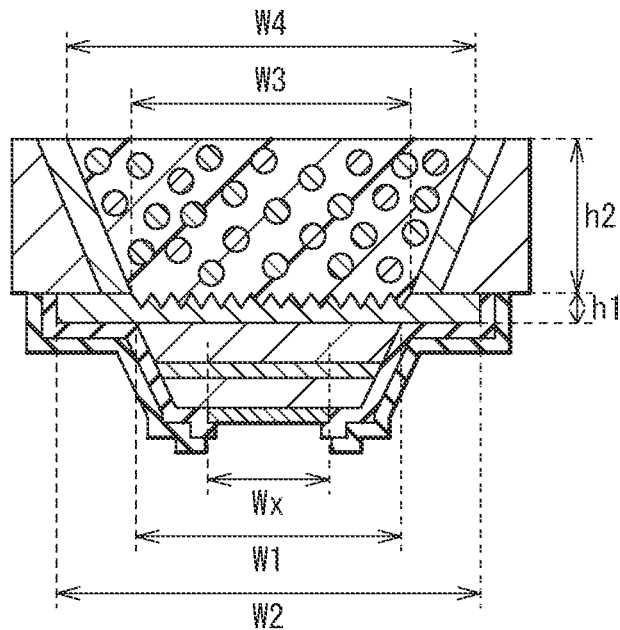
[FIG. 33]
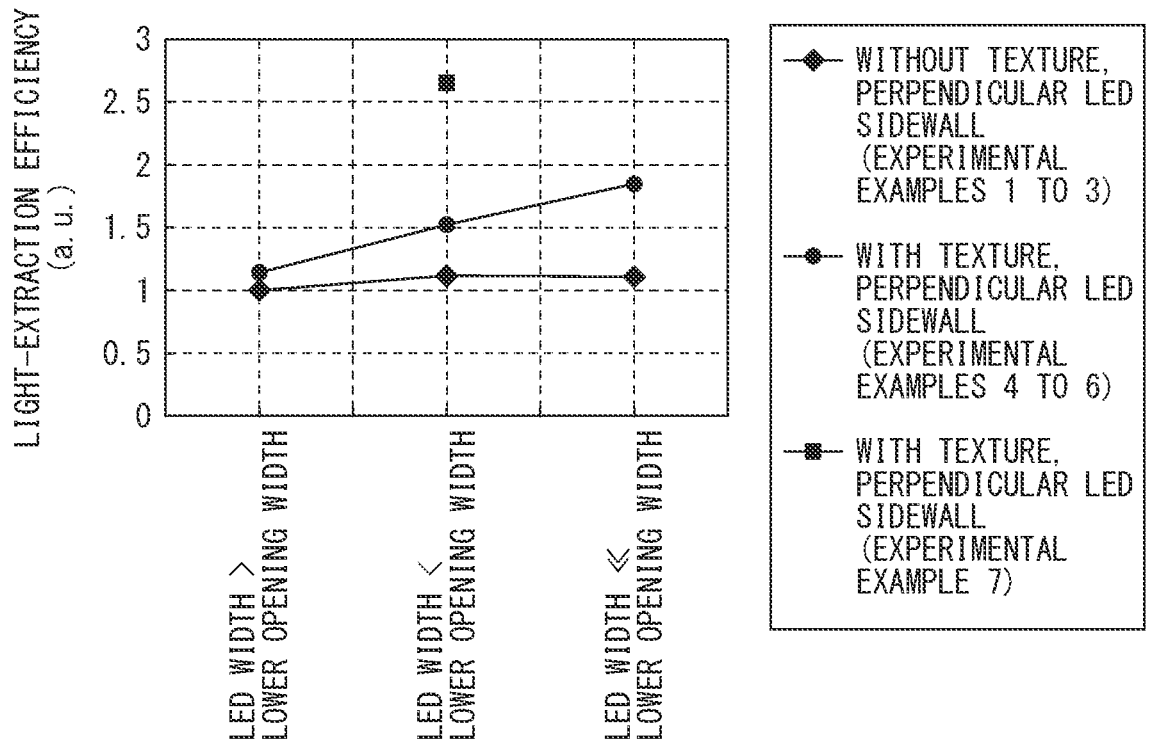

LIGHT-EMITTING DEVICE AND IMAGE DISPLAY APPARATUS

TECHNICAL FIELD

The present disclosure relates, for example, to a light-emitting device including a phosphor layer on an exit surface of a solid-state light source, and to an image display apparatus including the light-emitting device.

BACKGROUND ART

In recent years, an illumination apparatus and an image display apparatus including a plurality of light emitting diodes (LEDs) have become widely used. For example, an LED display has been proposed in which three LEDs that emit red (R), green (G), and blue (B) color light are used as one pixel, and these are arranged in a two-dimensional matrix. As a light source of the LED display, a color-conversion light-emitting apparatus has been developed in which a phosphor is disposed on the LED, and desired color development is obtained by color conversion by the phosphor.

Incidentally, an improvement in frontward light-extraction efficiency is demanded of a color-conversion light-emitting element that uses quantum-dots as a phosphor. As a method of improving the frontward light-extraction efficiency, for example, PTL 1 discloses a semiconductor light-emitting element in which a through hole is provided in a crystal growth substrate of an LED, and the crystal growth substrate is used as a reflector by filling the through hole with a phosphor.

CITATION LIST

Patent Literature

PTL 1: Japanese Unexamined Patent Application Publication No. 2003-258300

SUMMARY OF THE INVENTION

As described above, an improvement in light-extraction efficiency of a light-emitting device is demanded of the LED display in order to achieve high luminance and low electric power consumption.

It is desirable to provide a light-emitting device and an image display apparatus that make it possible to improve light-extraction efficiency.

A light-emitting device according to one embodiment of the present disclosure includes: a reflective structure having a first surface and a second surface and having, on the first surface, an opening whose side surface is provided with a first reflective film; a semiconductor light-emitting element including a first conductivity-type layer, an active layer, and a second conductivity-type layer that are stacked, the opening of the reflective structure and the active layer being disposed to be opposed to each other; and a support member having a light-transmitting property and having a first surface and a second surface, the semiconductor light-emitting element being disposed on the first surface side, the reflective structure being disposed on the second surface side, the second surface being at least partially in contact with the first surface of the reflective structure.

An image display apparatus according to one embodiment of the present disclosure includes a plurality of the above light-emitting devices according to one embodiment of the present disclosure.

In the light-emitting device according to one embodiment of the present disclosure and the image display apparatus according to one embodiment, the reflective structure having the opening whose side surface is provided with the reflective film (first reflective film) is stacked on the semiconductor light-emitting element, via the support member having a light-transmitting property. This makes an element size of the semiconductor light-emitting element equal to or smaller than the opening of the reflective structure.

BRIEF DESCRIPTION OF DRAWINGS

FIG. 1 is a schematic cross-sectional view of an example of a configuration of a light-emitting device according to a first embodiment of the present disclosure.

FIG. 2A is a schematic plan view of the light-emitting device illustrated in FIG. 1 as viewed from above.

FIG. 2B is a schematic plan view of the light-emitting device illustrated in FIG. 1 as viewed from below.

FIG. 3A is a plan view of examples of shapes of a support member and a reflective structure of the light-emitting device illustrated in FIG. 1.

FIG. 3B is a plan view of other examples of the shapes of the support member and the reflective structure of the light-emitting device illustrated in FIG. 1.

FIG. 3C is a plan view of other examples of the shapes of the support member and the reflective structure of the light-emitting device illustrated in FIG. 1.

FIG. 4A is a plan view (A) and a cross-sectional view (B) of an example of an uneven shape of the support member illustrated in FIG. 1.

FIG. 4B is a plan view (A) and a cross-sectional view (B) of another example of the uneven shape of the support member illustrated in FIG. 1.

FIG. 4C is a plan view (A) and a cross-sectional view (B) of another example of the uneven shape of the support member illustrated in FIG. 1.

FIG. 4D is a plan view (A) and a cross-sectional view (B) of another example of the uneven shape of the support member illustrated in FIG. 1.

FIG. 5A is a schematic cross-sectional view of an example of a manufacturing process of the light-emitting device illustrated in FIG. 1.

FIG. 5B is a schematic cross-sectional view of a process following FIG. 5A.

FIG. 5C is a schematic cross-sectional view of a process following FIG. 5B.

FIG. 5D is a schematic cross-sectional view of a process following FIG. 5C.

FIG. 5E is a schematic cross-sectional view of a process following FIG. 5D.

FIG. 5F is a schematic cross-sectional view of a process following FIG. 5E.

FIG. 5G is a schematic cross-sectional view of a process following FIG. 5F.

FIG. 5H is a schematic cross-sectional view of a process following FIG. 5G.

FIG. 5I is a schematic cross-sectional view of a process following FIG. 5H.

FIG. 5J is a schematic cross-sectional view of a process following FIG. 5I.

FIG. 5K is a schematic cross-sectional view of a process following FIG. 5J.

FIG. 5L is a schematic cross-sectional view of a process following FIG. 5K.

FIG. 6 is a schematic cross-sectional view of an example of a configuration of a light-emitting unit including a plurality of the light-emitting devices illustrated in FIG. 1.

FIG. 7 is a perspective view of an example of a configuration of an image display apparatus including the light-emitting unit illustrated in FIG. 6.

FIG. 8 is a schematic diagram illustrating an example of layout of the image display apparatus illustrated in FIG. 7.

FIG. 10 is a schematic cross-sectional view of an example of a configuration of a light-emitting device according to a second embodiment of the present disclosure.

FIG. 11 is a schematic cross-sectional view of an example of a configuration of a light-emitting device according to a modification example 1 of the present disclosure.

FIG. 12 is a schematic cross-sectional view of another example of the configuration of the light-emitting device according to the modification example 1 of the present disclosure.

FIG. 13 is a schematic cross-sectional view of another example of the configuration of the light-emitting device according to the modification example 1 of the present disclosure.

FIG. 14A is a schematic cross-sectional view of an example of a configuration of a light-emitting device according to a modification example 2 of the present disclosure.

FIG. 14B is a schematic cross-sectional view of another example of the configuration of the light-emitting device according to the modification example 2 of the present disclosure.

FIG. 14C is a schematic cross-sectional view of another example of the configuration of the light-emitting device according to the modification example 2 of the present disclosure.

FIG. 15 is a schematic diagram illustrating a cross-sectional shape of the light-emitting device illustrated in FIG. 14A.

FIG. 16A is a schematic diagram illustrating a cross-sectional shape at one position of the light-emitting device illustrated in FIG. 14B.

FIG. 16B is a schematic diagram illustrating a cross-sectional shape at another position of the light-emitting device illustrated in FIG. 14B.

FIG. 17 is a schematic cross-sectional view of an example of a configuration of a light-emitting device according to a modification example 3 of the present disclosure.

FIG. 18 is a schematic plan view of the light-emitting device illustrated in FIG. 17.

FIG. 19 is a schematic cross-sectional view of an example of a configuration of a light-emitting device according to a modification example 4 of the present disclosure.

FIG. 20 is a schematic cross-sectional view of another example of the configuration of the light-emitting device according to the modification example 4 of the present disclosure.

FIG. 21 is a schematic cross-sectional view of an example of a configuration of a light-emitting device according to a modification example 5 of the present disclosure.

FIG. 22 is a schematic cross-sectional view of another example of the configuration of the light-emitting device according to the modification example 5 of the present disclosure.

FIG. 23 is a schematic cross-sectional view of another example of the configuration of the light-emitting device according to the modification example 5 of the present disclosure.

FIG. 24 is a schematic cross-sectional view of an example of a configuration of a light-emitting device according to a modification example 6 of the present disclosure.

FIG. 25 is a schematic cross-sectional view of an example of a configuration of a light-emitting device according to a modification example 7 of the present disclosure.

FIG. 26 is a schematic cross-sectional view of a configuration of a light-emitting device of an experimental example 1.

FIG. 27 is a schematic cross-sectional view of a configuration of a light-emitting device of an experimental example 2.

FIG. 28 is a schematic cross-sectional view of a configuration of a light-emitting device of an experimental example 3.

FIG. 29 is a schematic cross-sectional view of a configuration of a light-emitting device of an experimental example 4.

FIG. 30 is a schematic cross-sectional view of a configuration of a light-emitting device of an experimental example 5.

FIG. 31 is a schematic cross-sectional view of a configuration of a light-emitting device of an experimental example 6.

FIG. 32 is a schematic cross-sectional view of a configuration of a light-emitting device of an experimental example 7.

FIG. 33 is a characteristic diagram illustrating light-extraction efficiency of the experimental examples 1 to 7.

MODES FOR CARRYING OUT THE INVENTION

Figure 9:
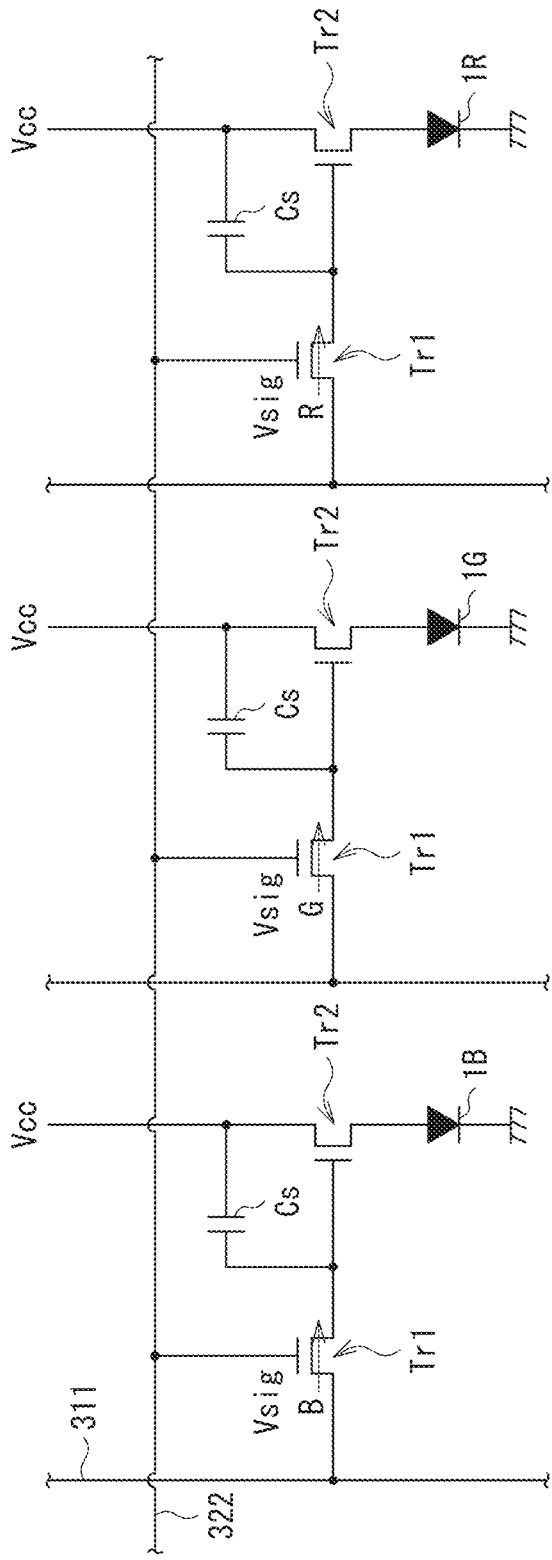
FIG. 9 is a pixel circuit diagram illustrating an active matrix driving method.

In the following, description is given of embodiments of the present disclosure in detail with reference to the drawings. The following description is merely a specific example of the present disclosure, and the present disclosure should not be limited to the following embodiments. Moreover, the present disclosure is not limited to arrangements, dimensions, dimensional ratios, and the like of each component illustrated in the drawings. It is to be noted that the description is given in the following order.

1. First Embodiment (An example of a light-emitting device including a support member between a light-emitting element and a reflective structure)
   1-1. Configuration of Light-Emitting Device
   1-2. Method of Manufacturing Light-Emitting Device
   1-3. Configuration of Light-Emitting Unit
   1-4. Configuration of Image Display Apparatus
   1-5. Workings and Effects
2. Second Embodiment (An example in which a side surface of the light-emitting element is tilted)
3. Modification Example 1 (An example in which a support member with electrical conductivity is used)
4. Modification Example 2 (An example of a shape of the support member)
5. Modification Example 3 (An example in which a filling layer is made to protrude to a second conductivity-type layer of the light-emitting element)
6. Modification Example 4 (An example of an opening shape of the reflective structure)
7. Modification Example 5 (An example in which bonding is performed with the use of an adhesive layer)
8. Modification Example 6 (An example in which a substrate with a light-transmitting property is used as the reflective structure)

9. Modification Example 7 (An example in which an optical member is provided on the reflective structure)

10. Examples

1. First Embodiment

FIG. 1 schematically illustrates an example of a cross-sectional configuration of a light-emitting device (light-emitting device 1) according to a first embodiment of the present disclosure. FIG. 2A schematically illustrates a planar configuration of the light-emitting device illustrated in FIG. 1 as viewed from above. FIG. 2B schematically illustrates a planar configuration of the light-emitting device illustrated in FIG. 1 as viewed from below. Note that FIG. 1 illustrates a cross section taken along line I-I illustrated in FIG. 2A and FIG. 2B. This light-emitting device 1 is suitably used as, for example, a display pixel of an image display apparatus (e.g., an image display apparatus 100, see FIG. 7) referred to as a so-called LED display.

The light-emitting device 1 according to the present embodiment includes a support member 20 having a light-transmitting property and a reflective structure 30 that are stacked in this order on the light-emitting surface (surface 10S2) side of a light-emitting element 10. The reflective structure 30 has an opening 30H at a position opposed to the light-emitting element 10, and a side surface (surface 30S3) of the opening 30H is provided with a reflective film 32. In the opening 30H, for example, a filling layer 33 is provided in which phosphor particles 331 and scattering particles 332 are dispersed in a resin 333.

(1-1. Configuration of Light-Emitting Device)

The light-emitting element 10 is a solid-state light-emitting element that emits light of a predetermined wavelength band from a top surface (light-extraction surface S2), and is an LED (Light Emitting Diode) chip, for example. The LED chip refers to a state of having been cut out from a wafer used for crystal growth, and indicates that it is not of a package type covered with a molded resin or the like. The LED chip has a size of, for example, 5 µm or more and 100 µm or less, and is referred to as a so-called micro LED. The light-emitting element 10 corresponds to a specific example of a "semiconductor light-emitting element" of the present disclosure.

The light-emitting element 10 includes a semiconductor layer including a first conductivity-type layer 11, an active layer 12, and a second conductivity-type layer 13 that are stacked in this order, and in which the second conductivity-type layer 13 serves as the light-extraction surface S2 (surface 10S2). This semiconductor layer is provided with a columnar mesa portion M including the first conductivity-type layer 11 and the active layer 12, and has, on the surface (surface 10S1) opposite to the light-extraction surface 10S2, a step constituted by a protrusion where the first conductivity-type layer 11 is exposed and a recess where the second conductivity-type layer 13 is exposed. In the present embodiment, the surface (surface 10S1 side) opposite to the light-extraction surface 10S2, including the protrusion and the recess, is referred to as a lower surface. Further, in planar view, the active layer 12 has a width equal to or smaller than the bottom of the opening 30H provided in the reflective structure 30. The light-emitting element 10 further includes a first electrode 14 electrically coupled to the first conductivity-type layer 11 and a second electrode 15 electrically coupled to the second conductivity-type layer 13. In the light-emitting element 10 according to the present embodiment, the first electrode 14 and the second electrode 15 are each provided on the surface 10S1 side. Specifically, the first electrode 14 is disposed on the surface 10S1 of the first conductivity-type layer, which is the protrusion of the lower surface, and the second electrode 15 is disposed on the surface 10S1 of the second conductivity-type layer, which is the recess of the lower surface.

A film stack 16 including an insulating film 16A and a reflective film 16B is provided on side surfaces of the first conductivity-type layer 11, the active layer 12, and the second conductivity-type layer 13 of the light-emitting element 10. The film stack 16 extends to the periphery of the first electrode 14 and the second electrode 15, for example, and the first electrode and the second electrode are exposed to the outside by an opening 16H1 provided on the first electrode 14 and an opening 16H2 provided on the second electrode 15. Further, the film stack 16 extends to a side surface of the support member 20 to be described later, and its end is in contact with, for example, the surface 20S2 of the reflective structure 30.

Material is selected as appropriate for the first conductivity-type layer 11, the active layer 12, and the second conductivity-type layer 13 included in the semiconductor layer, on the basis of light of a desired wavelength band. The light-emitting element 10 includes, for example, a Group III-V compound semiconductor material, and emits ultraviolet light having an emission wavelength of 360 nm or more and 430 nm or less, for example, or light of a blue band having an emission wavelength of 430 nm or more and 500 nm or less, for example. The active layer 12 is preferably formed using, for example, a GaInN-based material.

The first electrode 14 is in contact with the first conductivity-type layer 11 and is electrically coupled to the first conductivity-type layer 11. That is, the first electrode 14 is in ohmic contact with the first conductivity-type layer 11. The first electrode 14 is, for example, a metal electrode, and is configured as, for example, a multilayer film (Ni/Au) of nickel (Ni) and gold (Au). Alternatively, the first electrode 14 may be configured using, for example, a transparent electrically conductive material such as indium tin oxide (ITO).

The second electrode 15 is in contact with the second conductivity-type layer 13 and is electrically coupled to the second conductivity-type layer 13. That is, the second electrode 15 is in ohmic contact with the second conductivity-type layer 13. The second electrode 15 is, for example, a metal electrode, and is configured as, for example, a multilayer film (Ti/Al) of titanium (Ti) and aluminum (Al) or a multilayer film (Cr/Au) of chromium (Cr) and gold (Au). Alternatively, the second electrode 15 may be configured using, for example, a transparent electrically conductive material such as ITO.

The film stack 16 is a layer formed from the side surface to the lower surface of the semiconductor layer, as described above, and includes the insulating film 16A and the reflective film 16B stacked in this order on the semiconductor layer. The insulating film 16A and the reflective film 16B are each a thin film, and may be formed by, for example, a thin film forming process such as CVD, vapor deposition, or sputtering.

The insulating film 16A is configured to electrically isolate the reflective film 16B from the semiconductor layer. Examples of a material of the insulating film 16A include a material transparent to light emitted from the active layer 12, such as $SiO_2$, $Si_3N_4$, $Al_2O_3$, $TiO_2$, or TiN. The insulating film 16A has a thickness of, for example, about 50 nm to 1 µm. The reflective film 16B is configured to shield or reflect light emitted from the active layer 12. The reflective film 16B is formed in contact with the surface of the insulating film 16A. The reflective film 16B is formed, in the opening 16H1 and the opening 16H2, to a point slightly retracted than an end of the insulating film 16A, for example. Thus, the reflective film 16B is insulated (electrically separated) from the semiconductor layer, the first electrode 14, and the second electrode 15 by the insulating film 16A. The reflective film 16B includes a material that reflects light emitted from the active layer 12, for example, Ti, Al, copper (Cu), Au, Ni, or an alloy thereof. The reflective film 16B has a thickness of, for example, about 50 nm to 1 μm.

Note that an insulating film may further be formed on the reflective film 16B. In that case, it is preferable that the insulating film be formed, on the first electrode 14 and the second electrode 15, to the insulating film 16A so as to cover an end of the reflective film 16B. Thus, when mounting the light-emitting device 1 (1B, 1G, 1R) to be described later on a drive substrate 41, it is possible to prevent a short circuit between the reflective film 16B and bumps 44 and 45 that join pad electrodes 42 and 43 on the drive substrate 41 to the first electrode 14 and the second electrode 15 (see FIG. 6).

The support member 20 is configured to support the light-emitting element 10. The support member 20 is formed using a material having a light-transmitting property, and includes, for example, a group III-V compound semiconductor material. The support member 20 includes, for example, a GaN-based semiconductor material formed by crystal growth on a silicon (Si) substrate 31. Specifically, as will be described later in more detail, it includes a so-called buffer layer and template layer that are formed by crystal growth on the Si substrate. By the support member 20 supporting the light-emitting element 10, it is possible to make the light-emitting element 10 smaller than the size of an opening 31H of the reflective structure 30 on a surface 30S1 side to be described later. Further, it is possible to facilitate alignment between the light-emitting element 10 and the reflective structure 30.

The reflective structure 30 is configured to take out, upward, light (e.g., fluorescence, or Lb, Lg, and Lr to be described later) obtained by absorbing and wavelength-converting the light (excitation light EL) emitted from the light-emitting element 10. The reflective structure 30 has opposite surfaces 30S1 and 30S2. The surface 30S1 is an entrance surface of the excitation light EL, and the surface 30S2 is a light-extraction surface of the wavelength-converted light. The reflective structure 30 includes a Si substrate on which the semiconductor layer of the light-emitting element 10 and the above buffer layer and template layer are formed by crystal growth. The reflective structure 30 has an opening H penetrating between the surface 30S1 and the surface 30S2, for example. As opening width of the opening 30H, an opening width 31W2 on the surface 30S2 side is larger than an opening width 31W1 on the surface 30S1 side, and thus its side surface is a tilted surface (tapered). The side surface (surface 30S3) of the opening 30H is provided with the reflective film 32. In the opening 30H, the filling layer 33 is provided in which the plurality of phosphor particles 331 and the plurality of scattering particles 332 are dispersed in the resin 333, as described above.

The reflective film 32 is configured to reflect, into the filling layer 33, the excitation light EL emitted from the light-emitting element 10 and scattered by the scattering particles 332, for example, and fluorescence emitted from the phosphor grains 3331. The reflective film 32 is preferably formed using a material having high reflectance for the excitation light EL and the fluorescence, regardless of a light incidence angle. Examples of a material of the reflective film 32 include gold (Au), silver (Ag), aluminum (Al), platinum (Pt), and the like.

The filling layer 33 absorbs and wavelength-converts the excitation light EL emitted from the light-emitting element 10, and includes the plurality of phosphor particles 331 and the plurality of scattering particles 332 dispersed in the resin 333, as described above.

The phosphor particles 331 absorb the excitation light EL emitted from the light-emitting element 10 and emit fluorescence. For example, the phosphor particles 331 are a particulate phosphor that emits fluorescence having a blue wavelength of 430 nm or more and 500 nm or less, a green wavelength of 500 nm or more and 550 nm or less, or a red wavelength of 610 nm or more and 780 nm or less. For example, an inorganic phosphor, an organic phosphor, and a quantum dot phosphor may be used for the phosphor particles 331. It is desirable that the phosphor particles 331 have an average particle size of 100 nm or less, for example, and in that case, it is desirable to use a quantum dot phosphor, for example. Alternatively, it is desirable to use, for example, a fine-particle phosphor of 3 μm or less.

The greatest factor determining a fluorescent wavelength (fluorescent color) of a quantum dot phosphor is bandgap energy of a constituent material of the quantum dots. Therefore, it is desirable to select the material in accordance with the desired fluorescent color. For example, in a case of obtaining red fluorescence, the quantum dot phosphor material is preferably selected from, for example, InP, GaInP, InAsP, CdSe, CdZnSe, CdTeSe, CdTe, and the like. In a case of obtaining green fluorescence, the quantum dot phosphor material is preferably selected from, for example, InP, GaInP, ZnSeTe, ZnTe, CdSe, CdZnSe, CdS, CdSeS, and the like. In a case of obtaining blue fluorescence, the quantum dot phosphor material is preferably selected from ZnSe, ZnTe, ZnSeTe, CdSe, CdZnSe, CdS, CdZnS, CdSeS, and the like. Note that the quantum dot phosphor material is not limited to the above, and $CuInSe_2$, $CuInS_2$, CuInGaS, $AgInS_2$, and the like may be used, for example. In addition, for example, a Perovskite nano-phosphor including $CsPb(Cl/Br)_3$, $CsPbBr_3$, $CsPb(I/Br)_3$, $CsPbI_3$, and the like may be used.

Further, the fluorescent color of a quantum dot phosphor may also be controlled depending on its particle size. For example, the fluorescence wavelength becomes shorter as the particle size decreases. In order to obtain fluorescence with high color purity, it is desirable to select phosphor particles having controlled particle size.

It is preferable that a quantum dot phosphor have an average particle size of, for example, 5 nm or more and 100 nm or less, and have, for example, a core/shell structure including a light-emitting core portion with an average particle size of about 2 nm to 10 nm, and a shell layer covering and protecting the core portion. The shell layer includes one layer or a plurality of layers. The shell layer may further be covered with an inorganic film, such as silicon oxide ($SiO_2$) or aluminum oxide ($Al_2O_3$). A large number of organic ligands are coordinated to the surface of the quantum dot phosphor. When the quantum dot phosphor and a solvent are mixed, aggregation of the quantum dot phosphor is suppressed and dispersibility is improved by these organic ligands.

For filling with the quantum dot phosphor, for example, an ink jet or needle dispenser that discharges or applies it is used, depending on the viscosity of a resin mixed with the quantum dot phosphor. This is classified as a plate-less printing method, which method allows only the inside of a barrier to be selectively filled with the quantum dot phosphor, thus enabling more efficient use of the quantum dot phosphor material. The quantum dot phosphor may be applied to predetermined locations using a plate printing method such as screen printing or gravure printing technique. Alternatively, the quantum dot phosphor material may be applied to the entire base material, as with a spin-coater or the like.

The scattering particles 332 are configured to scatter the excitation light EL emitted from the light-emitting element 10 and the fluorescence emitted from the phosphor particles 331, and to reduce the polarization of light distribution. The scattering particles 332 preferably have a larger average particle size than the phosphor particles 331 and a larger refractive index than a filler 123. As the scattering particles 332, for example, a dielectric substance having a particle size of 100 nm or more and 1000 nm or less is preferably used. Specific examples of a material of the scattering particles 332 include silicon oxide ($SiO_2$), titanium oxide ($TiO_2$), aluminum oxide ($Al_2O_3$), aluminum nitride (AlN), boron nitride (BN), zinc oxide (ZnO), and the like.

Note that the scattering particles 332 may be, for example, bubbles mixed in the filler 123 or the phosphor particles 331 aggregated.

The resin 333 is configured to homogeneously disperse the phosphor particles 331 and the scattering particles 332, and it is preferably formed using, for example, a material having a light-transmitting property with respect to the excitation light EL. Specific examples of a material of the resin 333 include ultraviolet curable resins and thermosetting resins. Alternatively, sol-gel glass or the like may be used.

Note that the resin 333 does not necessarily have to be provided, and the phosphor particles 331 and the scattering particles 332 may be enclosed in a hollow structure.

Further, FIG. 2A illustrates the reflective structure 30 having a square (regular square) planar shape, but the planar shape of the reflective structure 30 is not limited thereto. For example, it may be a rectangular shape as illustrated in FIG. 3A, a circle or elliptical shape as illustrated in FIG. 3B, or a polygonal shape illustrated in FIG. 3C.

Furthermore, the light-emitting device 1 preferably has an uneven structure at the interface between the support member 20 and the filling layer 33. That is, the support member 20 preferably has an uneven structure 20C on the surface 20S2 of the support member 20 opposed to the opening 31H of the reflective structure 30. This makes it possible to guide, of the excitation light EL emitted from the light-emitting element 10, light that has become smaller than a critical angle by light equal to or greater than the critical angle being repeatedly reflected in the light-emitting element 10, into the filling layer 33. The uneven structure 20C may be formed, for example, by randomly roughening the surface (surface 20S2) of the support member 20 by an etchant. Alternatively, the uneven structure 20C may be formed using, for example, photolithography. In a case of forming the uneven structure 20C using photolithography, its shape may be controlled. The shape of a protrusion 20C1 included in the uneven structure 20C may be, for example, a conical shape as illustrated in FIG. 4A and FIG. 4B, or may be a polygonal shape as illustrated in FIG. 4C and FIG. 4D. Note that (A) in FIG. 4A to FIG. 4D is a plan view of the light-emitting device 1 viewed from above, and (B) is a cross-sectional view of the support member 20 taken along line II-II illustrated in (A) in FIG. 4A to FIG. 4D.

(1-2. Method of Manufacturing Light-Emitting Device)

The light-emitting device 1 according to the present embodiment may be produced as follows, for example. FIGS. 5A to 5L illustrate an example of a manufacturing process of the light-emitting device 1.

First, as illustrated in FIG. 5A, for example, an AlN film or a AlGaN film is grown on a surface 31S1 of the Si substrate 31 having a thickness of 200 µm to 400 µm, for example, by using metal-organic chemical vapor deposition (MOCVD), for example, to form the buffer layer. Next, a SiN layer or a i-GaN layer is grown on the buffer layer using the MOCVD, for example, to form the template layer. Subsequently, on the support member 20, for example, the second conductivity-type layer 13 including a n-GaN layer, a multiple quantum well active layer (the active layer 12) in which a InGaN layer and a GaN layer are alternately stacked, and the first conductivity-type layer 11 including a p-GaN layer are formed in order.

Next, as illustrated in FIG. 5B, the first conductivity-type layer 11 and the active layer 12 and a portion of the second conductivity-type layer 13 are removed, by dry etching for example. Subsequently, as illustrated in FIG. 5C, by dry etching for example, the second conductivity-type layer 13 except for a light-emitting region and a region constituting the recess of the lower surface is removed. Next, the template layer and the buffer layer are processed, by dry etching for example, as illustrated in FIG. 5D. Thus, the support member 20 is formed on the Si substrate 31.

Subsequently, as illustrated in FIG. 5E, for example, a palladium (Pd) film is formed on the first conductivity-type layer 11 by a vapor deposition method, for example, and thereafter the Pd film is processed by lift-off to form the first electrode 14. Next, as illustrated in FIG. 5F, for example, a film stack of Ti/Pt/Au is formed on the second conductivity-type layer 13 by the vapor deposition method, for example, and thereafter the Ti/Pt/Au film is processed by lift-off to form the second electrode 15. Subsequently, the insulating film 16A including, for example, silicon oxide ($SiO_2$) is formed from the surfaces of the first electrode 14 and the second electrode 15 to the side surfaces of the first conductivity-type layer 11, the active layer 12, and the second conductivity-type layer 13, and to the surface 20S1 and the side surface of the support member 20, using chemical vapor deposition (CVD), for example. Next, portions of the insulating film 16A on the first electrode 14 and the second electrode 15 are removed by wet etching for example, exposing the first electrode 14 and the second electrode 15. Subsequently, as illustrated in FIG. 5H, for example, a silver (Ag) film is formed on the insulating film 16A by sputtering, for example, and thereafter, the Ag film on the first electrode 14 and the second electrode 15 is removed by wet etching, for example, exposing the first electrode 14 and the second electrode 15.

Next, after bonding the light-emitting element 10 to a glass substrate or the like, as illustrated in FIG. 5I, the Si substrate 31 is thinned to a thickness of 30 µm or less by grinding or polishing, for example. Subsequently, as illustrated in FIG. 5J, the Si substrate 31 is removed by, for example, isotropic wet etching using an etchant including hydrogen fluoride (HF), nitric acid ($HNO_3$), and water ($H_2O$). Thus, the opening 31H penetrating the surface 30S2 and the surface 30S1 of the Si substrate 31 is formed.

Note that the opening 31H may be formed by anisotropic etching. The reflective structure includes a Si(100) substrate. If the Si substrate 31 is etched with a potassium hydroxide (KOH) solution, it is anisotropically etched due to a difference in etch rate depending on a crystal plane. Anisotropic etching of the Si(100) substrate 31 results in a slope due to a 55° crystal plane of a Si(111) plane. By utilizing this slope as a sidewall (side surface) of the opening 30H, it is possible to obtain the reflective structure 30 with a uniform side surface angle. The angle of the opening 30H of the reflective structure 30 influences upward light-extraction efficiency and light distribution characteristics. Therefore, by using the above anisotropic etching, it is possible to obtain the light-emitting device 1 with high uniformity.

Next, as illustrated in FIG. 5K, the surface (surface 20S2) of the support member 20 in the opening 30H is etched using, for example, a KOH solution. Thus, the uneven structure 20C is formed on the surface (surface 20S2) of the support member 20 in the opening 30H. At this time, the reflective structure 30 is protected by a protective film such as a resist film (not illustrated). Subsequently, as illustrated in FIG. 5L, an Ag film is formed on the side surface (surface 30S3) of the opening 30H by sputtering, for example, and thereafter the Ag film except for the side surface (surface 30S3) of the opening 30H is removed by, for example, wet etching. Finally, after filling the opening 30H, by ink jet for example, with the resin 333 in which the phosphor particles 331 and the scattering particles 332 are dispersed, the resin 333 is cured by heat treatment to form the filling layer 33. In this manner, the light-emitting device 1 illustrated in FIG. 1 etc. is manufactured.

(1-3. Configuration of Light-Emitting Unit)

FIG. 6 schematically illustrates, for example, a cross-sectional configuration of a light-emitting unit 1A to be used as a display pixel of the image display apparatus 100.

The light-emitting unit 1A includes a plurality of the light-emitting devices 1 arranged in a row with a predetermined gap between each other. The light-emitting unit 1A has, for example, an elongated shape extending in the arrangement direction of the light-emitting devices 1. The gap between the two light-emitting devices 1 adjacent to each other is, for example, equal to or larger than the size of each light-emitting device 1. Note that the gap may be narrower than the size of each light-emitting device 1 in some cases.

Each of the light-emitting devices 1 is configured to emit light of different wavelengths from each other. For example, as illustrated in FIG. 6, the light-emitting unit 1A includes three light-emitting device of a light-emitting device 1B that emits blue band fluorescence (Lb), a light-emitting device 1G that emits green band fluorescence (Lg), and a light-emitting device 1R that emits red band fluorescence (Lr). For example, in a case where the light-emitting unit 1A has an elongated shape extending in the arrangement direction of the light-emitting devices 1, the light-emitting device 1B is disposed, for example, in the vicinity of a short side of the light-emitting unit 1A, and the light-emitting device 1R is disposed, for example, in the vicinity of a short side that is different from the short side adjacent to the light-emitting device 1B of the short sides of the light-emitting unit 1A. The light-emitting device 1G is disposed, for example, between the light-emitting device 1R and the light-emitting device 1B. Note that respective positions of the light-emitting devices 1B, 1G, and 1R are not limited to the above.

In each of the light-emitting devices 1B, 1G, and 1R, for example, the reflective structure 30 including the filling layer 33 is disposed on the light-emitting element 10 that emits blue light as the excitation light EL, via the support member 20, at a position opposed to the corresponding one of the light-emitting devices 1B, 1G, and 1R. In the filling layer 33 disposed on the light-emitting device 1B, for example, only the scattering particles 332 are dispersed in the resin 333, and the excitation light EL emitted from the light-emitting element 10 is scattered by the scattering particles 332 to be taken out as blue light Lb. In the filling layer 33 of the light-emitting device 1G, the phosphor particles 331 that emit green fluorescence and the scattering particles 332 are dispersed in the resin 333, and the excitation light EL emitted from the light-emitting element 10 is converted to green light by the phosphor particles 331 and scattered by the scattering particles 332 to be taken out as green light Lg. In the filling layer 33 of the light-emitting device 1R, the phosphor particles 331 that emit red fluorescence and the scattering particles 332 are dispersed in the resin 333, and the excitation light EL emitted from the light-emitting element 10 is converted to red light by the phosphor particles 331 and scattered by the scattering particles 332 to be taken out as red light Lr.

As illustrated in FIG. 6, the light-emitting unit 1A is, for example, mounted on the drive substrate 41 via the pad electrodes 42 and 43 and the bumps 44 and 45. Note that mounting on the drive substrate 41 may be performed using another bonding method such as Cu—Cu bonding.

Note that, although FIG. 6 illustrates the light-emitting unit 1A that emits fluorescence of three colors corresponding to RGB, the configuration of the light-emitting unit 1A is not limited thereto. For example, the light-emitting unit 1A may be configured as a light-emitting unit of single color fluorescence including a plurality of light-emitting devices that emit light of the same wavelength as each other, or may be configured as a light-emitting unit that emits fluorescence of two colors such as RG and RB, for example. Alternatively, it may be configured as a light-emitting unit that emits fluorescence of four or more colors such as RGBW. Furthermore, FIG. 6 illustrates, for example, the light-emitting unit 1A included in each display pixel of the image display apparatus 100, but is not limited thereto. For example, all the display pixels of the image display apparatus 100 may be configured with one light-emitting unit 1A. In that case, the light-emitting devices 1B, 1G, and 1R corresponding to RGB are regularly arranged in a mosaic shape.

(1-4. Configuration of Image Display Apparatus)

FIG. 7 is a perspective view of an example of a schematic configuration of the image display apparatus (the image display apparatus 100). The image display apparatus 100 is referred to as a so-called LED display, and an LED is used as a display pixel. The image display apparatus 100, for example, includes a display panel 1010, and a drive circuit (not illustrated) that drives the display panel 1010, as illustrated in FIG. 7.

The display panel 1010 includes a mounting substrate 1020 and a transparent substrate 1030 overlaid on each other. The surface of the transparent substrate 1030 is an image display surface, and has a display region 100A in a middle portion and a frame region 100B that is a non-display region around it.

FIG. 8 illustrates an example of layout of a region corresponding to the display region 100A of the surface of the mounting substrate 1020 on the transparent substrate 1030 side. In the region corresponding to the display region 100A of the surface of the mounting substrate 1020, a plurality of data lines 1021 are formed to extend in a predetermined direction, and are arranged in parallel at a predetermined pitch, for example, as illustrated in FIG. 8. In the region corresponding to the display region 100A of the surface of the mounting substrate 1020, further, a plurality of scanning lines 1022 are formed to extend in a direction intersecting (e.g., orthogonal to) the data lines 1021, and are arranged in parallel at a predetermined pitch, for example.

The data lines 1021 and the scanning lines 1022 include, for example, an electrically conductive material such as Cu (copper).

The scanning lines 1022 are, for example, formed on the outermost layer, and are, for example, formed on an insulating layer (not illustrated) formed on the base material surface. Note that the base material of the mounting substrate 1020 includes, for example, a glass substrate, a resin substrate, or the like, and the insulating layer on the base material includes, for example, $SiN_x$, $SiO_x$, or $Al_xO_y$. On the other hand, the data lines 1021 are formed in a layer different from the outermost layer including the scanning lines 1022 (e.g., a layer below the outermost layer), and are, for example, formed in the insulating layer on the base material. On the surface of the insulating layer, in addition to the scanning lines 1022, black is provided as necessary, for example. The black is configured to enhance contrast, and includes a light-absorbing material. The black is formed, for example, in at least regions where pad electrodes 1021B and 1022B to be described later are not formed on the surface of the insulating layer. Note that it is also possible to omit the black, as necessary.

The vicinity of the intersection portion between the data line 1021 and the scanning line 1022 is a display pixel 1023, and a plurality of the display pixels 1023 are arranged in a matrix in the display region 100A. Each display pixel 1023 is mounted with the light-emitting unit 1A that includes the plurality of light-emitting devices 1. Note that FIG. 8 illustrates a case where one display pixel 1023 includes the three light-emitting devices 1R, 1G, and 1B, and is configured to output red light from the light-emitting device 1R, green light from the light-emitting device 1G, and blue light from the light-emitting device 1B.

Note that the image display apparatus 100 illustrated in FIG. 7 is an example of a passive matrix type image display apparatus, and the light-emitting device 1 according to the present embodiment may also be applied to an active matrix type image display apparatus. Note that, in the active matrix type image display apparatus, the frame region 100B illustrated in FIG. 7 is not necessary, for example.

In the passive matrix type driving method, time allocated to each light-emitting device becomes shorter if the number of scanning lines is increased. Accordingly, injected current has to be increased with a decrease in duty cycle, which can cause luminous efficiency and device life to decrease. To avoid this, it is necessary to lower a maximum luminance setting value. In addition, because of issues such as a voltage drop and signal delay caused by wiring resistance and parasitic capacitance, a large-screen or high-definition image display apparatus with a large number of scanning lines adopts a method of dividing the screen into a plurality of partial screens and performing passive matrix driving in parallel, or a method of actively driving the light-emitting device. In the parallel passive matrix driving, it is necessary to couple the driver circuit by drawing wiring to the back side for each partial screen, and also to divide and parallelize image signals in accordance with the partial screens, for example. This can result in complication of the structure of the display apparatus as a whole and an increase in the circuit size. On the other hand, in the active driving method, by providing signal voltage holding and a voltage-current conversion circuit in units of pixels, it is possible to obtain higher luminance than the passive matrix driving, in a state where the screen division as described above is not performed or at least the number of divisions is small.

FIG. 9 illustrates an example of a pixel circuit of a typical active matrix driving method. In the active matrix driving method, a switching transistor (Tr1), a driving transistor (Tr2), and a capacitor (Cs) are provided for each pixel (the light-emitting devices 1R, 1G, and 1B, the vicinity of the intersection portion between the data line 1021 and the scanning line 1022). In the active matrix driving method, in addition to writing Vsig to the capacitor by using the switching transistor as a switch, the light-emitting device is current-modulated by using the driving transistor as a current source for current control based on a potential difference of a power supply (Vcc)–Vsig. Actually, because characteristics vary from transistor to transistor, the current applied to the light-emitting device at each pixel varies even if the same Vsig is written, and display uniformity of the image display apparatus decreases. Therefore, a circuit that corrects variations in transistor characteristics is generally added, but in a case of using a light-emitting device in which emission wavelength changes with a change in current, it is desirable to perform gradation control by pulse-width modulation together as will be described later, which makes the circuit more complicated. The light-emitting device according to the present embodiment reduces the change in emission wavelength with the change in current, allowing the image display apparatus to be configured with a relatively simple current modulation driver circuit.

In the light-emitting unit 1A, for example, a pair of terminal electrodes are provided for each of the light-emitting devices 1R, 1G, and 1B. Further, one terminal electrode is electrically coupled to the data line 1021, for example, and the other terminal electrode is electrically coupled to the scanning line 1022, for example. For example, the terminal electrode is electrically coupled to the pad electrode 1021B at a tip of a branch 1021A provided in the data line 1021. Further, for example, the terminal electrode is electrically coupled to the pad electrode 1022B at a tip of a branch 1022A provided in the scanning line 1022.

The pad electrodes 1021B and 1022B are, for example, formed on the outermost layer, and are, for example, provided at a region where each light-emitting unit 1A is to be mounted, as illustrated in FIG. 7. Here, the pad electrodes 1021B and 1022B include, for example, an electrically conductive material such as Au (gold).

The drive circuit drives each display pixel 1023 (each light-emitting unit 1A) on the basis of an image signal. The drive circuit includes, for example, a data driver that drives the data line 1021 coupled to the display pixel 1023, and a scan driver that drives the scanning line 1022 coupled to the display pixel 1023. The drive circuit may, for example, be mounted on the mounting substrate 1020, or may be provided separately from the display panel 1010 and coupled to the mounting substrate 1020 via wiring (not illustrated).

(1-5. Workings and Effects)

In the light-emitting device 1 according to the present embodiment, the light-emitting element 10 and the reflective structure 30 are stacked with the support member 20 having a light-transmitting property therebetween. This makes an element size of the light-emitting element 10 equal to or smaller than an opening width 30W1 of the opening 30H of the reflective structure 30 opposed to the light-emitting element 10.

Therefore, in the light-emitting device 1 according to the present embodiment, less light is absorbed by the Si substrate 31 included in the reflective structure 30, making it possible to improve light-extraction efficiency.

Further, in the light-emitting device 1 according to the present embodiment, the uneven structure 20C is provided on the surface 20S2 of the support member 20 facing the filling layer 33 provided in the opening 30H of the reflective structure 30. This changes a reflection angle at the interface between the support member 20 and the filling layer 33, making it possible to reduce the loss of components that typically have been totally reflected at the interface between the light-emitting element 10 and the filling layer 33. Therefore, it is possible to further improve the light-extraction efficiency.

Further, in the light-emitting element 10 referred to as a so-called micro-LED, as in the light-emitting device 1 according to the present embodiment, the influence of positional deviation between the light-emitting element 10 and the filling layer 33 of the reflective structure 30 is larger than that of an LED of a typical size (e.g., 100 μm or more and 10 mm or less). Therefore, it is desired to suppress the positional deviation to, for example, 2 μm or less. To address this, in the present embodiment, the light-emitting element 10 and the reflective structure 30 are manufactured by an integrated semiconductor-process as described above, which makes it possible to obtain a light-emitting device with small positional deviation. Thus, it is possible to provide a light-emitting device with uniform light-extraction efficiency and light distribution characteristics.

Furthermore, in the present embodiment, it is possible to seal the periphery of the filling layer 33 with a solid, which reduces intrusion of moisture and oxygen. Further, the present embodiment enables fabrication without using an adhesive between the light-emitting element 10 and the filling layer 33, which eliminates the influence of deterioration of the adhesive due to the excitation light EL emitted from the light-emitting element 10. Therefore, it is possible to improve reliability.

Next, a second embodiment and modification examples 1 to 7 will be described. Note that the same reference numerals are assigned to components corresponding to those of the light-emitting device 1 according to the first embodiment, and descriptions thereof are omitted.

2. Second Embodiment

FIG. 10 schematically illustrates an example of a cross-sectional configuration of a light-emitting device (light-emitting device 2) according to the second embodiment of the present disclosure. This light-emitting device 2 is suitably used as, for example, a display pixel of an image display apparatus referred to as so-called LED display, as with the light-emitting device 1 in the first embodiment.

The light-emitting device 2 includes the support member 20 having a light-transmitting property and the reflective structure 30 that are stacked in this order on the light-emitting surface (surface 10S2) side of the light-emitting element 10. The reflective structure 30 has the opening 30H at a position opposed to the light-emitting element 10, and the side surface (surface 30S3) of the opening 30H is provided with the reflective film 32. In the opening 30H, for example, the filling layer 33 is provided in which the phosphor particles 331 and the scattering particles 332 are dispersed in the resin 333. The light-emitting device 2 according to the present embodiment differs from the first embodiment in that the columnar mesa portion M including the first conductivity-type layer 11 and the active layer 12 included in the light-emitting element 10 has a tilted surface (surface 10S3) intersecting a stacking direction (Y-axis direction). Further, the side surface of the support member 20 is also a tilted surface, as with the light-emitting element 10 according to the present embodiment.

Thus, tilting the side surfaces of the semiconductor layer included in the light-emitting element 10 and the support member 20 changes the reflection angle of the light reflected by the side surfaces of the semiconductor layer and the support member 20. Specifically, it is possible to change the light to components with an angle equal to or smaller than the critical angle. Therefore, in addition to the effects of the first embodiment, an effect of making it possible to further improve the light-extraction efficiency is achieved.

3. Modification Example 1

FIG. 11 schematically illustrates an example of a cross-sectional configuration of a light-emitting device (light-emitting device 3A) according to the modification example 1 of the present disclosure. This light-emitting device 3A is suitably used as, for example, a display pixel of an image display apparatus referred to as so-called LED display, as with the light-emitting device 1 in the first embodiment.

The light-emitting device 3A includes the support member 20 having a light-transmitting property and the reflective structure 30 that are stacked in this order on the light-emitting surface (surface 10S2) side of the light-emitting element 10. The reflective structure 30 has the opening 30H at a position opposed to the light-emitting element 10, and the side surface (surface 30S3) of the opening 30H is provided with the reflective film 32. In the opening 30H, for example, the filling layer 33 is provided in which the phosphor particles 331 and the scattering particles 332 are dispersed in the resin 333. The light-emitting device 3A of the present modification example differs from the first embodiment in that the support member 20 is formed using a material having electrical conductivity. Therefore, it is possible to dispose the second electrode 15 on the surface 20S1 of the support member 20, and electrically couple it to the second conductivity-type layer 13 via the support member 20. Further, it is possible to form the second conductivity-type layer 13 as the same shape as the first conductivity-type layer 11 and the active layer 12, which reduces the components propagating to the recess side of the second conductivity-type layer 13. Therefore, in addition to the effects of the first embodiment, an effect of making it possible to further improve the light-extraction efficiency is achieved. Further, a process of separately processing the second conductivity-type layer 13 is not necessary, which simplifies the manufacturing process.

Further, the Si substrate 31 of the reflective structure 30 may be formed using a material having electrical conductivity. Thus, as in a light-emitting device 3B the light-emitting device 3B illustrated in FIG. 12 and a light-emitting device 3C illustrated in FIG. 13, it is possible to install the second electrode 15 on the surface 30S1 of the reflective structure 30 or on the surface 30S2. This enlarges the area of the side surface of the light-emitting element 10 covered by the reflective film 16B. Therefore, it is possible to further improve the light-extraction efficiency. Further, the flexibility in disposing the second electrode 15 is improved.

4. Modification Example 2

FIG. 14A schematically illustrates an example of a planar configuration of a light-emitting device (light-emitting device 4A) according to the modification example 2 of the present disclosure as viewed from above. This light-emitting device 4A is suitably used as, for example, a display pixel of an image display apparatus referred to as so-called LED display, as with the light-emitting device 1 in the first embodiment.

The first embodiment describes an example in which the support member 20 covers the front surface of the light-extraction surface 10S2 of the light-emitting element 10, but is not limited thereto. It is sufficient if the support member 20 at least partially extends outward than the light-emitting element 10, as illustrated in FIG. 14A. Therefore, as in a light-emitting device 4B illustrated in FIG. 14B and a light-emitting device 4C illustrated in FIG. 14C, the support member 20 may be divided and arranged on the light-extraction surface 10S2 of the light-emitting element 10. Note that FIG. 15 illustrates a cross section of the light-emitting device 4A taken along line illustrated in FIG. 14A. FIG. 16A illustrates a cross section of the light-emitting device 4B taken along line IV-IV illustrated in FIG. 14B, and FIG. 16B illustrates a cross section of the light-emitting device 4B taken along line V-V illustrated in FIG. 14B.

5. Modification Example 3

FIG. 17 schematically illustrates an example of a cross-sectional configuration of a light-emitting device (light-emitting device 5) according to the modification example 3 of the present disclosure. FIG. 18 schematically illustrates an example of a planar configuration of the light-emitting device 5 illustrated in FIG. 17 as viewed from above. This light-emitting device 5 is suitably used as, for example, a display pixel of an image display apparatus referred to as so-called LED display, as with the light-emitting device 1 in the first embodiment.

The light-emitting device 5 includes the support member 20 having a light-transmitting property and the reflective structure 30 that are stacked in this order on the light-emitting surface (surface 10S2) side of the light-emitting element 10. The reflective structure 30 has the opening 30H at a position opposed to the light-emitting element 10, and the side surface (surface 30S3) of the opening 30H is provided with the reflective film 32. The light-emitting device 5 of the present modification example differs from the first embodiment in that a peripheral portion of the opening 30H where the support member 20 and the filling layer 33 are in contact with each other is provided with a groove G penetrating to the support member 20 and a portion of the second conductivity-type layer 13, and that the filling layer 33 protrudes to the second conductivity-type layer 13 via the groove G. Note that the groove G is preferably provided on the outer side than a light-emitting region X of the light-emitting element 10. Further, the groove G is preferably formed intermittently at the peripheral portion of the opening 30H to ensure a current injection route rE.

Thus, the peripheral portion of the opening 30H where the support member 20 and the filling layer 33 are in contact with each other, on the outer side than the light-emitting region X of the light-emitting element 10, is provided with the groove G penetrating the support member 20 and a portion of the second conductivity-type layer 13, and the groove G is filled with the filling layer 33. This enables the components of the excitation light EL and the fluorescence propagating laterally to be reflected to the inner side than the light-emitting region X. Therefore, in addition to the effects of the first embodiment, an effect of making it possible to further improve the light-extraction efficiency is achieved.

6. Modification Example 4

FIG. 19 schematically illustrates an example of a cross-sectional configuration of a light-emitting device (light-emitting device 6A) according to the modification example 4 of the present disclosure. FIG. 20 schematically illustrates another example of a cross-sectional configuration of a light-emitting device (light-emitting device 6B) according to the modification example 4 of the present disclosure. These light-emitting devices 6A and 6B are suitably used as, for example, a display pixel of an image display apparatus referred to as so-called LED display, as with the light-emitting device 1 in the first embodiment.

The first embodiment describes an example in which the side surface (surface 30S3) of the opening 30H of the reflective structure 30 is tilted, but is not limited thereto. For example, the side surface (surface 30S3) of the opening 30H may be a curved surface as illustrated in FIG. 19, or may be perpendicular to the surfaces 30S1 and 30S2 of the reflective structure 30 as illustrated in FIG. 20.

In the light-emitting device 6A, curving the side surface (surface 30S3) of the opening 30H increases a proportion of light being reflected upward at the side surface (surface 30S3) of the opening 30H, as compared with the light-emitting device 1 illustrated in FIG. 1, for example, where the surface 30S3 is a slope of a constant angle. This allows for a further improvement in the light-extraction efficiency.

In the light-emitting device 6B, making the side surface (surface 30S3) of the opening 30H perpendicular causes the light-extraction efficiency to decrease, as compared with the case where the surface 30S3 is a slope of a constant angle, but an effect of making it possible to reduce the element size is achieved.

7. Modification Example 5

FIG. 21 schematically illustrates an example of a cross-sectional configuration of a light-emitting device (light-emitting device 7A) according to the modification example 5 of the present disclosure. This light-emitting device 7A is suitably used as, for example, a display pixel of an image display apparatus referred to as so-called LED display, as with the light-emitting device 1 in the first embodiment.

The light-emitting device 7A of the present modification example includes the light-emitting element 10 and the support member 20 bonded together via an adhesive layer 51. The light-emitting element 10 is grown on a sapphire substrate, for example. The light-emitting device 7A may be manufactured as follows.

First, after forming the components up to the first conductivity-type layer 11 as in the first embodiment on the sapphire substrate, the sapphire substrate is peeled off using a laser lift-off (LLO) method. Next, a Si(100) substrate is separately prepared, and a $SiO_2$ film is formed on the surface of the Si(100) substrate by plasma CVD, for example, to form the support member 20. Subsequently, the Si(100) substrate is processed using anisotropic etching to form the reflective structure 30, and thereafter the light-emitting element 10 from which the sapphire substrate has been peeled off and the support member 20 are bonded together via the adhesive layer 51. Thereafter, the film stack 16 including the insulating film 16A and the reflective film 16B and covering the side surface of the light-emitting element 10 and the side surface of the support member 20 is formed using the methods described in the first embodiment, and thereafter the opening 30H and an uneven structure 20S on the surface 20S2 of the support member 20 in the opening 30H are formed, and the filling layer 33 is formed in the opening 30H.

Thus, by bonding the light-emitting element 10 and the support member 20 together using the adhesive layer 51 to form the light-emitting device 7A, it is possible to use a crystal growth substrate and a crystal growth method that are generally widely used. Therefore, it is possible to obtain a light-emitting element of high luminous efficiency at low cost.

Using the present modification example makes it possible to fabricate the reflective structure 30 with a resin mold, which improves the flexibility in the side surface shape of the opening 30H of the reflective structure 30. Therefore, in addition to the effects in the first embodiment, an effect of making it possible to improve controllability of the light distribution characteristics is achieved.

Note that the light-emitting device 7A illustrates an example of bonding the light-emitting element 10 and the support member 20 together via the adhesive layer 51, but is not limited thereto. For example, as in a light-emitting device 7B illustrated in FIG. 22, the support member 20 and the reflective structure 30 may be bonded together via the adhesive layer 51. Further, as in a light-emitting device 7C illustrated in FIG. 23, the adhesive layer 51 may be provided only at the outside of the opening 30H, and the support member 20 and the reflective structure 30 may be bonded together. Thus, it is possible to reduce the influence of the deterioration of the adhesive due to the excitation light EL emitted from the light-emitting element 10.

8. Modification Example 6

FIG. 24 schematically illustrates an example of a cross-sectional configuration of a light-emitting device (light-emitting device 8) according to the modification example 6 of the present disclosure. This light-emitting device 8 is suitably used as, for example, a display pixel of an image display apparatus referred to as so-called LED display, as with the light-emitting device 1 in the first embodiment.

The reflective structure 30 may be formed using, for example, a sapphire substrate 61 having a light-transmitting property. In that case, the opening 30H does not necessarily have to penetrate the surface 30S1 and the surface 30S2 of the reflective structure 30, and a portion of the surface 30S1 may be left.

Note that a portion left of the sapphire substrate 61 may be used as the support member 20. Further, in a case of forming the reflective structure 30 using a base material having a light-transmitting property like the sapphire substrate 61, it is preferable to cause the reflective film 32 to extend on the surface 30S2 serving as a light-extraction surface, as illustrated in FIG. 24. This makes it possible to reduce the occurrence of color mixing by the excitation light EL propagating through the sapphire substrate 61.

9. Modification Example 7

FIG. 25 schematically illustrates an example of a cross-sectional configuration of a light-emitting device (light-emitting device 9) according to the modification example 7 of the present disclosure. This light-emitting device 9 is suitably used as, for example, a display pixel of an image display apparatus referred to as so-called LED display, as with the light-emitting device 1 in the first embodiment.

The light-emitting device 9 of the present modification example differs from the first embodiment in that a sealing layer 52, an excitation light removing layer 53, an adhesive layer 54, and a lens 55 are formed in this order on the reflective structure 30.

The sealing layer 52 seals the filling layer 33 and transmits fluorescence. As the sealing layer 52, for example, it is preferable to form a TEOS-SiO$_2$ film able to be formed at low temperature, using plasma CVD. Other examples of a material of the sealing layer 52 include SiN$_x$, AlO$_x$, and the like.

The excitation light removing layer 53 is configured to prevent deterioration of a color gamut due to transmission of excitation light. As the excitation light removing layer 53, for example, it is preferable to form a yellow filter using spin coating, for example.

The lens 55 is configured to optimize, in accordance with the application, the light distribution characteristics of the Lambertian that is taken out from the surface 30S2 of the reflective structure 30, and to increase the light utilization efficiency. The lens 55 is bonded onto the excitation light removing layer 53 via the adhesive layer 54. As the lens 55, a resin lens fabricated by a resin mold may be used. Alternatively, it may include another material, such as glass.

10. Examples

In the following, ray-trace simulation was performed to verify the fluorescence extraction efficiency, including examples of the present disclosure.
(Simulation 1)

Table 1 summarizes configurations of light-emitting devices (experimental examples 1 to 7) for which the ray simulation was performed. FIGS. 26 to 32 illustrate the cross-sectional shapes of the respective light-emitting devices used as the experimental examples 1 to 7. Table 1 summarizes an element size (W1) of a light-emitting element, a support member width (W2), a lower opening width (W3), and an upper opening width (W4) as relative values with respect to a light-emitting region width (Wx) of the light-emitting element.

TABLE 1

| | Wx | W1 | W2 | W3 | W4 | h1 |
|---|---|---|---|---|---|---|
| Experimental Example 1 | 1 | 2.2 | — | 1.5 | 2.5 | 0.6 |
| Experimental Example 2 | 1 | 1.4 | 2.2 | 1.5 | 2.5 | 0.6 |
| Experimental Example 3 | 1 | 1.03 | 2.2 | 1.5 | 2.5 | 0.6 |
| Experimental Exantple 4 | 1 | 2.4 | — | 1.5 | 2.5 | 0.6 |
| Experimental Example 5 | 1 | 1.4 | 2.2 | 1.5 | 2.5 | 0.6 |
| Experimental Example 6 | 1 | 1.03 | 2.2 | 1.5 | 2.5 | 0.6 |
| Experimental Example 7 | 1 | 1.4 | 2.2 | 1.5 | 2.5 | 0.6 |

FIG. 31 illustrates simulation results of the fluorescence extraction efficiency in the experimental examples 1 to 7. The results of the experimental examples 1 to 3 and the experimental examples 4 to 6 indicate that the light-extraction efficiency is improved by making the element size (W1) of the light-emitting element smaller than the lower opening width (W3) of the reflective structure. In addition, comparison between the results of the experimental examples 1 to 3 and the experimental examples 4 to 6 indicate that the providing of the support member (or the surface of the light-emitting element) with the uneven structure improves the light-extraction efficiency, and that the uneven structure exerts a great effect particularly when the element size (W1) of the light-emitting element is smaller than the lower opening width (W3). Furthermore, the result of the experimental example 7 indicates that the light-extraction efficiency is greatly improved by tilting the side surface of the light-emitting element.

Although the present disclosure has been described above with reference to the first and second embodiments, the modification examples 1 to 7, and the examples, the present disclosure is not limited to the above embodiments, and various modifications may be made. It is to be noted that the effects described in this specification are merely illustrative and non-limiting, and other effects may be provided.

It is to be noted that the present technology may have the following configurations. According to the present technology having the following configurations, the reflective structure having the opening whose side surface is provided with the reflective film (first reflective film) is stacked on the semiconductor light-emitting element, via the support member having a light-transmitting property. This makes an element size of the semiconductor light-emitting element equal to or smaller than the opening of the reflective structure. Therefore, it is possible to improve the light-extraction efficiency.

(1)
A light-emitting device including:
a reflective structure having a first surface and a second surface and having, on the first surface, an opening whose side surface is provided with a first reflective film;
a semiconductor light-emitting element including a first conductivity-type layer, an active layer, and a second conductivity-type layer that are stacked, the opening of the reflective structure and the active layer being disposed to be opposed to each other; and
a support member having a light-transmitting property and having a first surface and a second surface, the semiconductor light-emitting element being disposed on the first surface side, the reflective structure being disposed on the second surface side, the second surface being at least partially in contact with the first surface of the reflective structure.

(2)
The light-emitting device according to (1), in which the support member has unevenness on at least a portion of the second surface opposed to the reflective structure.

(3)
The light-emitting device according to (1) or (2), in which the opening is filled with a resin containing a plurality of scattering particles.

(4)
The light-emitting device according to (3), in which the resin filling the opening further contains a plurality of phosphor particles that converts light emitted from the semiconductor light-emitting element into a different wavelength.

(5)
The light-emitting device according to any one of (1) to (4), in which, in planar view, the active layer has a size equal to or smaller than a bottom of the opening of the reflective structure.

(6)
The light-emitting device according to any one of (1) to (5), in which the active layer of the semiconductor light-emitting element has a width of 5 μm or more and 100 μm or less.

(7)
The light-emitting device according to any one of (1) to (6), in which
the semiconductor light-emitting element includes a first electrode electrically coupled to the first conductivity-type layer, and a second electrode electrically coupled to the second conductivity-type layer, and
in a stack of the semiconductor light-emitting element and the support member, a second reflective film is further provided on a surface of the semiconductor light-emitting element, excluding the first electrode and the second electrode, and on the first surface and a side surface of the support member.

(8)
The light-emitting device according to any one of (1) to (7), in which in the semiconductor light-emitting element, a side surface of a semiconductor layer including the first conductivity-type layer, the active layer, and the second conductivity-type layer stacked is a tilted surface intersecting a stacking direction.

(9)
The light-emitting device according to (7), in which
the support member has electrical conductivity and is in contact with the second conductivity-type layer, and
the second electrode is provided on the first surface of the support member.

(10)
The light-emitting device according to any one of (7) to (9), in which
the reflective structure and the support member have electrical conductivity, and the support member is in contact with the second conductivity-type layer, and
the second electrode is provided on the first surface or the second surface of the reflective structure.

(11)
The light-emitting device according to any one of (3) to (10), in which the resin filling the opening of the reflective structure is at least partially in contact with the first conductivity-type layer or the second conductivity-type layer of the semiconductor light-emitting element.

(12)
The light-emitting device according to any one of (3) to (11), in which
the support member has a through hole, and
the resin filling the opening of the reflective structure protrudes, via the through hole, into the first conductivity-type layer or the second conductivity-type layer of the semiconductor light-emitting element.

(13)
The light-emitting device according to any one of (1) to (12), further including an adhesive layer between the reflective structure and the support member or between the support member and the semiconductor light-emitting element.

(14)
The light-emitting device according to any one of (1) to (13), in which at least one of a sealing layer or an excitation light removing layer is further disposed on the first surface side of the reflective structure.

(15)
The light-emitting device according to any one of (1) to (14), in which a lens is further disposed on the first surface side of the reflective structure.

(16)
The light-emitting device according to any one of (1) to (15), in which the side surface of the opening has a taper angle at which a cross-section of the opening extends from the second surface of the reflective structure toward the first surface of the reflective structure.

(17)
The light-emitting device according to any one of (3) to (16), in which the scattering particles include a dielectric substance having an average particle size of 100 nm or more and 1000 nm or less.

(18)
The light-emitting device according to any one of (3) to (17), in which the scattering particles include at least one of silicon oxide (SiO2), titanium oxide (TiO2), aluminum oxide (Al2O3), aluminum nitride (AlN), boron nitride (BN), or zinc oxide (ZnO).

(19)

The light-emitting device according to any one of (4) to (18), in which the phosphor particles include a quantum dot phosphor.

(20)

An image display apparatus including a plurality of light-emitting devices, each of the plurality of light-emitting devices including
  a reflective structure having a first surface and a second surface and having, on the first surface, an opening whose side surface is provided with a first reflective film,
  a semiconductor light-emitting element including a first conductivity-type layer, an active layer, and a second conductivity-type layer that are stacked, the opening of the reflective structure and the active layer being disposed to be opposed to each other, and
  a support member having a light-transmitting property and having a first surface and a second surface, the semiconductor light-emitting element being disposed on the first surface side, the reflective structure being disposed on the second surface side, the second surface being at least partially in contact with the first surface of the reflective structure.

This application claims the benefit of Japanese Priority Patent Application No. 2019-010813 filed with the Japan Patent Office on Jan. 25, 2019, the entire contents of which are incorporated herein by reference.

It should be understood by those skilled in the art that various modifications, combinations, sub-combinations and alterations may occur depending on design requirements and other factors insofar as they are within the scope of the appended claims or the equivalents thereof.

The invention claimed is:

1. A light-emitting device comprising:
  a reflective structure having a first surface and a second surface and having, on the first surface, an opening whose side surface is provided with a first reflective film;
  a semiconductor light-emitting element including a first conductivity-type layer, an active layer, and a second conductivity-type layer that are stacked, the opening of the reflective structure and the active layer being disposed to be opposed to each other; and
  a support member having a light-transmitting property and having a first surface and a second surface, the semiconductor light-emitting element being disposed on the first surface side, the reflective structure being disposed on the second surface side, the second surface being at least partially in contact with the first surface of the reflective structure,
  wherein the support member has unevenness on at least a portion of the second surface opposed to the reflective structure, and
  wherein, in planar view, the active layer has a size smaller than a bottom of the opening of the reflective structure.

2. The light-emitting device according to claim 1, wherein the opening is filled with a resin containing a plurality of scattering particles.

3. The light-emitting device according to claim 2, wherein the resin filling the opening further contains a plurality of phosphor particles that converts light emitted from the semiconductor light-emitting element into a different wavelength.

4. The light-emitting device according to claim 1, wherein the active layer of the semiconductor light-emitting element has a width of 5 µm or more and 100 µm or less.

5. The light-emitting device according to claim 1, wherein
  the semiconductor light-emitting element includes a first electrode electrically coupled to the first conductivity-type layer, and a second electrode electrically coupled to the second conductivity-type layer, and
  in a stack of the semiconductor light-emitting element and the support member, a second reflective film is further provided on a surface of the semiconductor light-emitting element, excluding the first electrode and the second electrode, and on the first surface and a side surface of the support member.

6. The light-emitting device according to claim 1, wherein in the semiconductor light-emitting element, a side surface of a semiconductor layer including the first conductivity-type layer, the active layer, and the second conductivity-type layer stacked is a tilted surface intersecting a stacking direction.

7. The light-emitting device according to claim 5, wherein
  the support member has electrical conductivity and is in contact with the second conductivity-type layer, and
  the second electrode is provided on the first surface of the support member.

8. The light-emitting device according to claim 5, wherein
  the reflective structure and the support member have electrical conductivity, and the support member is in contact with the second conductivity-type layer, and
  the second electrode is provided on the first surface or the second surface of the reflective structure.

9. The light-emitting device according to claim 2, wherein the resin filling the opening of the reflective structure is at least partially in contact with the first conductivity-type layer or the second conductivity-type layer of the semiconductor light-emitting element.

10. The light-emitting device according to claim 2, wherein
  the support member has a through hole, and
  the resin filling the opening of the reflective structure protrudes, via the through hole, into the first conductivity-type layer or the second conductivity-type layer of the semiconductor light-emitting element.

11. The light-emitting device according to claim 1, further comprising an adhesive layer between the reflective structure and the support member or between the support member and the semiconductor light-emitting element.

12. The light-emitting device according to claim 1, wherein at least one of a sealing layer or an excitation light removing layer is further disposed on the first surface side of the reflective structure.

13. The light-emitting device according to claim 1, wherein a lens is further disposed on the first surface side of the reflective structure.

14. The light-emitting device according to claim 1, wherein the side surface of the opening has a taper angle at which a cross-section of the opening extends from the second surface of the reflective structure toward the first surface of the reflective structure.

15. The light-emitting device according to claim 2, wherein the scattering particles comprise a dielectric substance having an average particle size of 100 nm or more and 1000 nm or less.

16. The light-emitting device according to claim 2, wherein the scattering particles include at least one of silicon oxide (SiO2), titanium oxide (TiO2), aluminum oxide (Al2O3), aluminum nitride (AlN), boron nitride (BN), or zinc oxide (ZnO).

17. The light-emitting device according to claim 3, wherein the phosphor particles comprise a quantum dot phosphor.

18. An image display apparatus comprising a plurality of light-emitting devices, each of the plurality of light-emitting devices including
- a reflective structure having a first surface and a second surface and having, on the first surface, an opening whose side surface is provided with a first reflective film,
- a semiconductor light-emitting element including a first conductivity-type layer, an active layer, and a second conductivity-type layer that are stacked, the opening of the reflective structure and the active layer being disposed to be opposed to each other, and
- a support member having a light-transmitting property and having a first surface and a second surface, the semiconductor light-emitting element being disposed on the first surface side, the reflective structure being disposed on the second surface side, the second surface being at least partially in contact with the first surface of the reflective structure, wherein the support member has unevenness on at least a portion of the second surface opposed to the reflective structure, and wherein, in planar view, the active layer has a size smaller than a bottom of the opening of the reflective structure.

* * * * *